(12) United States Patent
Arimura

(10) Patent No.: US 7,546,095 B2
(45) Date of Patent: Jun. 9, 2009

(54) FREQUENCY MULTIPLIER

(75) Inventor: Kazuyoshi Arimura, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 742 days.

(21) Appl. No.: 10/062,423

(22) Filed: Feb. 5, 2002

(65) Prior Publication Data

US 2003/0017812 A1   Jan. 23, 2003

(30) Foreign Application Priority Data

Jul. 19, 2001  (JP)  ............................. 2001-219349

(51) Int. Cl.
*H04B 1/04*  (2006.01)
(52) U.S. Cl. ....................... 455/112; 327/116
(58) Field of Classification Search ................. 455/112, 455/313, 316–320, 119; 327/116, 119, 122
See application file for complete search history.

(56) References Cited

U.S. PATENT DOCUMENTS

| | | | | |
|---|---|---|---|---|
| 3,922,593 A * | 11/1975 | McGuffin et al. | ............ | 327/116 |
| 4,374,346 A * | 2/1983 | Tsuchiya et al. | ............. | 315/276 |
| 4,658,323 A * | 4/1987 | Dougherty | ................... | 361/79 |
| 4,691,170 A * | 9/1987 | Riley | ............................ | 327/116 |
| 5,166,836 A * | 11/1992 | Choi | ............................ | 360/41 |
| 5,194,820 A * | 3/1993 | Besson et al. | ................ | 327/122 |
| 5,703,509 A * | 12/1997 | Hirata | .......................... | 327/119 |
| 5,708,399 A * | 1/1998 | Fujii et al. | ................... | 332/103 |
| 5,815,014 A * | 9/1998 | Zhang et al. | ................. | 327/122 |
| 6,072,374 A * | 6/2000 | Takahashi | .................... | 332/117 |
| 6,100,731 A * | 8/2000 | Otaka | .......................... | 327/119 |
| 6,369,622 B1 * | 4/2002 | Lim et al. | .................... | 327/116 |
| 6,456,836 B1 * | 9/2002 | Nakajima et al. | ............ | 455/319 |
| 6,529,051 B2 * | 3/2003 | Tokumitsu et al. | .......... | 327/119 |
| 6,545,481 B1 * | 4/2003 | Emberty et al. | ............. | 324/521 |
| 6,564,045 B1 * | 5/2003 | Fransis | ........................ | 455/318 |
| 6,664,824 B2 * | 12/2003 | Laws | ........................... | 327/122 |
| 7,298,808 B1 * | 11/2007 | Rey | ............................ | 375/372 |

* cited by examiner

*Primary Examiner*—Sam Bhattacharya
(74) *Attorney, Agent, or Firm*—Arent Fox LLP

(57) ABSTRACT

It is intended to provide a frequency multiplier capable of switching as appropriate among frequency signals having frequencies obtained by multiplying prescribed multiplication numbers with low current consumption and a simple circuit configuration in effectively utilizing frequencies in radio communication equipment. The base terminals of an input differential pair are biased by respective voltage sources, and an input frequency signal is input to one of the base terminals. The differential output terminals are connected to the base terminals of next-stage buffer circuit transistors, and their emitter terminals are connected to respective diodes. A full-wave-rectified signal, which is obtained at the connecting point of the cathode terminals of the diodes, is input to a comparison differential pair, which produces an output frequency signal by comparing the full-wave-rectified signal with a reference voltage. The frequency of the output frequency signal is switched as appropriate between the same frequency as the frequency of the input frequency signal and its double frequency by the manner of setting the bias voltages of the voltage sources.

23 Claims, 14 Drawing Sheets

FIRST PRINCIPLE DIAGRAM OF THE INVENTION

FIRST PRINCIPLE DIAGRAM OF THE INVENTION

SECOND PRINCIPLE DIAGRAM OF THE INVENTION

CIRCUIT BLOCK DIAGRAM OF A FREQUENCY MULTIPLIER ACCORDING TO A FIRST EMBODIMENT

FIG. 5 CIRCUIT DIAGRAM OF A FREQUENCY MULTIPLIER AS A MORE SPECIFIC EXAMPLE ACCORDING TO THE FIRST EMBODIMENT

FIG. 8  CIRCUIT BLOCK DIAGRAM OF A FREQUENCY MULTIPLIER ACCORDING TO A SECOND EMBODIMENT

FREQUENCY- MULTIPLIED WAVEFORM PRODUCED BY THE FREQUENCY MULTIPLIER OF FIG.8
(VB21 = VB22 = VB23 = VB24)

FIG. 10 FREQUENCY-MULTIPLIED WAVEFORM PRODUCED BY THE FREQUENCY MULTIPLIER OF FIG.8
(VB21 = VB22 = VB24 < VB23)

FREQUENCY-MULTIPLIED WAVEFORM PRODUCED BY THE FREQUENCY MULTIPLIER OF FIG.8
(VB21 = VB24 > VB22 = VB23)

FIG. 12 FREQUENCY-MULTIPLIED WAVEFORM PRODUCED BY THE FREQUENCY MULTIPLIER OF FIG.8
(VB21 = VB23 = VB24 > VB22)

CIRCUIT BLOCK DIAGRAM OF A FREQUENCY MULTIPLIER
ACCORDING TO A THIRD EMBODIMENT

CIRCUIT BLOCK DIAGRAM OF A FREQUENCY MULTIPLIER
ACCORDING TO A FOURTH EMBODIMENT

CIRCUIT BLOCK DIAGRAM OF A FREQUENCY MULTIPLIER
ACCORDING TO A FIRST CONVENTIONAL TECHNIQUE

CIRCUIT BLOCK DIAGRAM OF A FREQUENCY MULTIPLIER
ACCORDING TO A SECOND CONVENTIONAL TECHNIQUE

CIRCUIT DIAGRAM OF A MIXER CIRCUIT (FREQUENCY DOUBLER CIRCUIT) ACCORDING TO THE SECOND CONVENTIONAL TECHNIQUE

US 7,546,095 B2

FREQUENCY MULTIPLIER

BACKGROUND OF THE INVENTION

1. Field of the Invention

The present invention relates to a frequency multiplier. In particular, the invention relates to a frequency multiplier that is used in radio communication equipment and is capable of switching the output frequency.

2. Description of the Related Art

Nowadays, with the number of transmission carrier frequency bands increases for more effective use of frequencies, radio communication equipment such as cellular phones is increasingly used in such a manner that the carrier frequency is switched. Frequency multipliers also need to be used in such a manner that switching is made as appropriate among a plurality of frequencies (multiplication numbers), and are required to be able to switch the frequency easily. On the other hand, there are no bounds to the requirements of multi-functionality and size reduction for equipment. In portable equipment such as cellular phones that are a typical example of radio communication equipment, because of its portability, not only reduction in the equipment size and weight but also reduction in the current consumption during a communication operation are an important performance index.

In conventional radio communication equipment, to obtain a plurality of necessary frequencies, frequency multipliers having prescribed multiplication numbers, respectively, are incorporated for the respective frequencies or any of circuits shown in FIGS. 15 to 17 is used.

FIG. 15 shows a frequency multiplier 100 according to a first conventional technique, which is constituted of a switch circuit 110, a limiter amplifier 120, a bandpass filter (hereinafter abbreviated as BPF) 130, and an amplifier (hereinafter abbreviated as AMP) 140.

An input frequency signal $V_{IN}$ having a frequency f is input to the switch circuit 110. Controlled by a control circuit (not shown), the switch circuit 110 switches as appropriate between a path for directly outputting the input frequency signal $V_{IN}$ as an output frequency signal $V_{OUT}$ and a path for multiplying the frequency by a prescribed multiplication number. The input signal $V_{IN}$ that has been input to the path for multiplying the frequency by a prescribed multiplication number is limited in voltage amplitude by the limiter amplifier 120 so as to be shaped into a pseudo-rectangular wave. The BPF 130 extracts a prescribed frequency component from harmonic components of the pseudo-rectangular wave. The extracted frequency component is amplified by the AMP 140, whereby an output signal $V_{OUT}$ having a frequency obtained by multiplying the prescribed multiplication number is produced.

FIG. 16 shows a frequency multiplier 200 according to a second conventional technique, which is constituted of a switch circuit 110 and a mixer circuit 150.

As in the case of the first conventional technique, when input to the switch circuit 110, an input frequency signal $V_{IN}$ having a frequency f is subjected as appropriate to switching between a path for directly outputting the input frequency signal $V_{IN}$ as an output frequency signal $V_{OUT}$ and a path for multiplying the frequency by a prescribed multiplication number under the control of a control circuit (not shown). Having the mixer circuit 150, the path for multiplying the frequency by a prescribed multiplication number performs mixing processing on the two input frequency signals $V_{IN}$. That is, the mixer circuit 150 mixes the two input frequency signals $V_{IN}$ having the frequency f with each other and outputs a resulting signal.

FIG. 17 is a circuit diagram of a mixer circuit (frequency doubler circuit) 150A having a frequency multiplication number of 2, which is an example of the mixer circuit 150 in FIG. 16. Transistors Q101 and Q102 constitute a first differential pair. Their emitter terminal connecting point is connected to the ground GND (ground voltage) via a current source I100. The base terminals of the transistors Q101 and Q102 are DC-voltage-biased by a voltage source VB101 via respective resistors R101 and R102. An input frequency signal $V_{IN}$ is input to the base terminal of the transistor Q101. A capacitance C101 that is connected to the base terminal of the transistor Q102 is a grounding capacitance.

Resistance elements R103 and R104 as loads are connected to the first difference pair, Q101 and Q102. The connecting points of the resistance elements are connected to a next-stage buffer section, which is constituted of a transistor Q103, a current source I101, a transistor Q104, and a current source I102. The collector terminals (output terminals) of the first differential pair, Q101 and Q102 are connected to the base terminals of the respective transistors Q103 and Q104, whereby emitter follower circuits are formed.

A third stage to which output signals of the buffer section constitutes phase shift sections. The output terminals of the buffer section, which is constituted of the transistor Q103, the current source I101, the transistor Q104, and the current source I102, are connected to two kinds of phase shift sections, that is, a phase advancing section that is provided with a capacitance C102, a resistance element R105, a capacitance C103, and a resistance element R106 and a phase delaying section that is constituted of a resistance element R107, a capacitance C104, a resistance element R108, and a capacitance C105, whereby a phase difference of 90° is obtained. The phase advancing section is also provided with a voltage source VB102 between the connecting point of the resistance elements R105 and R106 and the ground GND.

Output signals of the phase shift sections are input to a fourth-stage mixer section. Specifically, the output terminals of the phase advancing section that are the connecting point of the capacitance C102 and the resistance element R105 and the connecting point of the capacitance C103 and the resistance element R106 are connected to a second differential pair, Q106 and Q105 and a third differential pair, Q107 and Q108 that have opposite input/output relationships. The output terminals of the phase delaying section that are the connecting point of the resistance element R107 and the capacitance C104 and the connecting point of the resistance element R108 and the capacitance C105 are connected to a fourth differential pair, Q110 and Q109 having the second differential pair, Q106 and Q105 and the third differential pair, Q107 and Q108 as loads. The second to fourth differential pairs are biased by a current source I103 and connected to load resistance elements R109 and R110.

In the mixer section, the second differential pair, Q106 and Q105 and the third differential pair, Q107 and Q108 have opposite input/output relationships and input signals to the second differential pair, Q106 and Q105 and the third differential pair, Q107 and Q108 and input signals to the fourth differential pair, Q110 and Q109 have a phase difference of 90°. Therefore, when the input signals to the second differential pair, Q106 and Q105 and the third differential pair, Q107 and Q108 have a peak voltage difference, the input signals to the fourth differential pair, Q110 and Q109 have no voltage difference. Conversely, when the input signals to the second differential pair, Q106 and Q105 and the third differential pair, Q107 and Q108 have no voltage difference, the input signals to the fourth differential pair, Q110 and Q109 have a peak voltage difference. Therefore, an output signal of the mixer section is switched every half cycle of the input frequency signal $V_{IN}$, whereby the frequency is doubled.

However, in the frequency multiplier 100 according to the first conventional technique, when an input signal $V_{IN}$ having only a single frequency component originally is modulated into a rectangular waveform by the limiter amplifier 120, harmonic components included in the rectangular waveform are dominated by odd-numbered harmonic components. This results in a problem that even-numbered harmonic components such as a frequency-doubled component have low signal intensity and hence are hard to extract.

Further, the BPF 130 is necessary to extract a prescribed frequency component. If the signal intensity of a frequency component to be extracted is insufficient, amplification by the AMP 140 is also needed. It is unavoidable that the circuit scale and the current consumption become large. This is problematic when the frequency multiplier 100 is applied to, for example, portable equipment such as cellular phones, because neither high-density mounting nor low power consumption can be attained.

In the frequency multiplier 200 according to the second conventional technique, to obtain a frequency-doubled output frequency signal $V_{OUT}$ that is free of distortion, it is necessary to adjust the phase difference between output signals of the phase advancing section and those of phase delaying section correctly to 90°. To this end, it is necessary to accurately realize characteristic values of the capacitances C102 to C105 and the resistance elements R105 to R108 that constitute the phase advancing section and the phase delaying section. However, a characteristic value of each element for realizing an optimum operation point of the mixer circuit 150A is only one point. There are problems that designing work of determining element characteristic values is cumbersome and difficult, and that the output frequency signal $V_{OUT}$ deviates from the optimum state because of deviations of the element characteristic values due to dispersion in manufacture, differences in temperature characteristic, etc. of each element and it is difficult to maintain a correct output frequency signal $V_{OUT}$ over time and over differences in temperature characteristics.

Further, in the frequency multipliers 100 and 200 according to the first and second conventional techniques, the frequency of the output frequency signal $V_{OUT}$ is switched by switching the path of the input frequency signal $V_{IN}$ by the switch circuit 110. However, the current that is consumed to drive the switch circuit 110 is not negligible. This prevents reduction of the current consumption of the frequency multipliers 100 and 200 and hence is a problem.

SUMMARY OF THE INVENTION

The present invention has been made to solve the above problems in the related art, and an object of the invention is therefore to provide a frequency multiplier capable of switching as appropriate among frequency signals having frequencies obtained by multiplying prescribed multiplication numbers with low current consumption and a simple circuit configuration in effectively utilizing frequencies in radio communication equipment such as cellular phones.

To attain the above object, one aspect of the invention provides a frequency multiplier comprising a phase shift section for generating at least one phase shift signal for a fundamental signal; a waveform combining section for generating a combined waveform by combining the fundamental signal with the phase shift signal; and a comparator section for comparing the combined waveform with a comparison threshold value.

In the above frequency multiplier, at least one phase shift signal generated by the phase shift section through phase shifting is combined with a fundamental signal by the waveform combining section. A resulting combined waveform is compared with the comparison threshold value by the comparator section, whereby an output frequency signal is obtained.

To attain the above object, another aspect of the invention provides a frequency multiplier comprising a phase shift section for generating at least one phase shift signal for a fundamental signal; a level shift section for shifting amplitude levels of at least one of the fundamental signal and the phase shift signal; a waveform combining section for generating a combined waveform by combining the fundamental signal with the phase shift signal; and a comparator section for comparing the combined waveform with a comparison threshold value.

In the above frequency multiplier, after the amplitude levels of at least one among a fundamental signal and at least one phase shift signal that has been generated by the phase shift section through phase shifting are shifted by the level shift section, the signals are combined together by the waveform combining section. A resulting combined waveform is compared with the comparison threshold value by the comparator section, whereby an output frequency signal is obtained.

With the configuration having the phase shift section, the waveform combining section, and the comparator section, the frequency of an output frequency signal can be switched easily by switching between a state that at least one phase shift signal generated by the phase shift section through phase shifting exists and a state that such phase shift signals do not exist, without the need for complex processing of selecting and extracting a prescribed frequency component from a waveform such as a rectangular wave having harmonic components. Whereas some harmonic components are difficult to extract as a signal having a prescribed frequency because of low signal intensity, with the above configuration sufficiently high signal intensity can be secured and hence an output frequency signal having a prescribed frequency can be output reliably.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Frequency multipliers according to first to fourth embodiments of the present invention will be hereinafter described with reference to FIGS. 3 to 14. Before describing the first to fourth embodiments, the principles of the first and second embodiments and those of the third and fourth embodiments will be described with reference to first and second principle diagrams, respectively.

Figure 1:
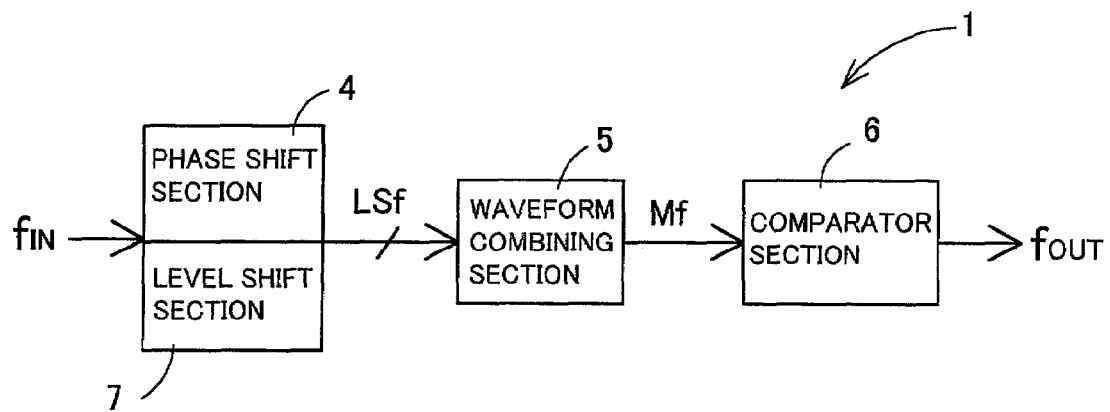
FIG. 1 is a block diagram as a first principle diagram of the invention.

FIG. 1 is the first principle diagram. An input frequency signal $f_{IN}$ having a frequency component is input to a circuit block that is constituted of a phase shift section 4 and a level shift section 7. This circuit block generates, using the input frequency signal $f_{IN}$ as a fundamental signal, at least one signal in which the phase is shifted as appropriate, and shifts the amplitude levels of a desired one of the fundamental signal and the phase shift signal(s). As a result, there occurs a difference between peak/bottom voltages of the waveforms of the fundamental signal and the phase shift signal(s). Either of the generation of a phase shift signal and the amplitude level shift may be performed first. Then, a waveform combining section 5 combines the fundamental signal with the phase shift signal(s) (these signals are denoted by LSf) into a combined waveform Mf. Since the signal waveforms LSf having a phase difference(s) that have been produced by the phase shift section 4 are combined with each other, the cycle of the combined signal waveform Mf becomes shorter in accordance with the number of waveforms LSf to be combined with each other. Further, since the amplitude levels of each signal waveform Lsf are shifted as appropriate, peak/bottom voltage values in each cycle have a difference(s). A comparator section 6 compares the combined waveform Mf with a comparison threshold value. Therefore, the frequency of an output frequency signal $f_{OUT}$ can be switched in accordance with the number of phase shift signals that have been subjected to the combining, an amplitude level shift amount (s), and the comparison threshold value.

With the above configuration having the phase shift section, the level shift section, the waveform combining section, and the comparator section, the frequency of an output frequency signal can be switched easily without the need for the complex processing of selecting and extracting a prescribed frequency component from a waveform such as a rectangular wave having harmonic components. Whereas some harmonic components are difficult to extract as a signal having a prescribed frequency because of low signal intensity, with the above configuration sufficiently high signal intensity can be secured and hence an output frequency signal having a prescribed frequency can be output reliably.

Figure 2:
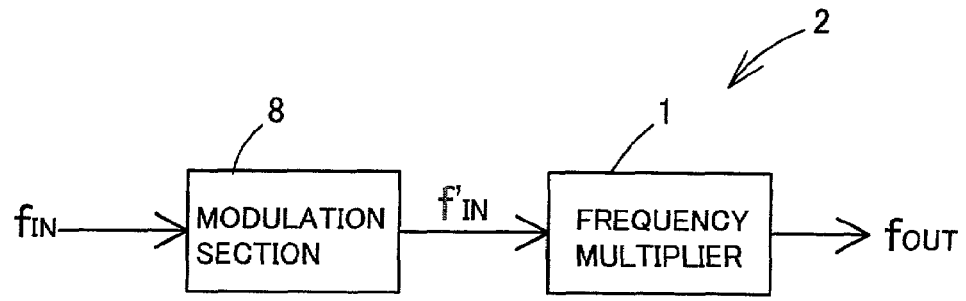
FIG. 2 is a block diagram as a second principle diagram of the invention.

FIG. 2 is the second principle diagram. Before inputting to the frequency multiplier 1 of the first principle diagram, an input frequency signal $f_{IN}$ having a frequency component is input to a modulation section 8. A modulated signal waveform $f'_{IN}$ produced by the modulation section 8 is input to the frequency multiplier 1. The modulation section 8 can switch the frequency arbitrarily before the frequency switching in the frequency multiplier 1. The modulation section 8 may be an FM modulator or a V/F converter, for example.

With the above configuration, a signal having an arbitrary frequency produced from an input signal by the FM modulator or the V/F converter can be made an input signal of the frequency multiplier 1. Therefore, switching can be made to a signal having an arbitrary frequency, which can be output as an output frequency signal.

Figure 3:
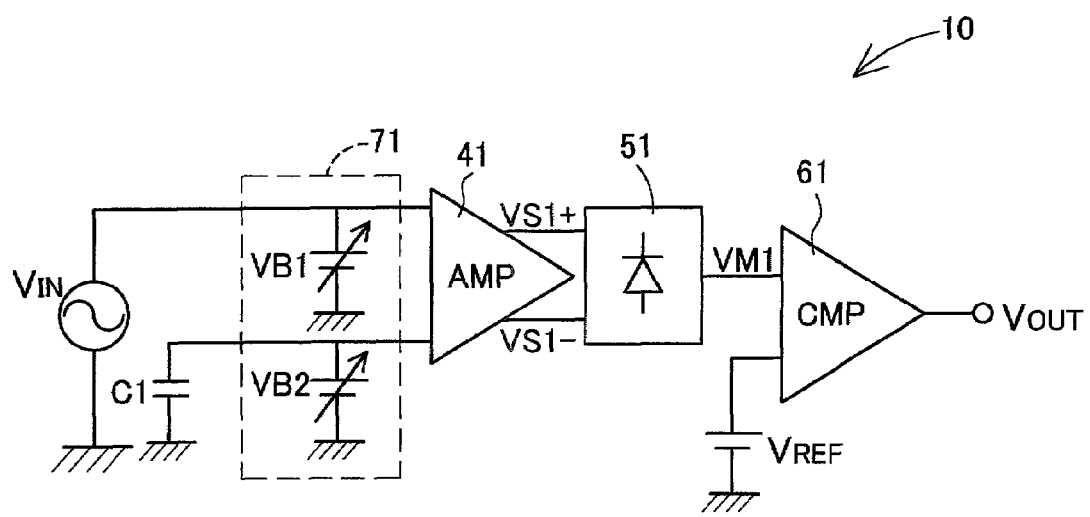
FIG. 3 is a circuit block diagram of a frequency multiplier according to a first embodiment of the invention.

Specific embodiments will be described below. FIG. 3 shows a frequency multiplier 10 according to the first embodiment. The frequency multiplier 10 of FIG. 3 corresponds to the frequency multiplier 1 shown in the first principle diagram (FIG. 1), and is a circuit that converts an input frequency signal $V_{IN}$ into an output frequency signal whose frequency is the same as or two times the frequency of the input frequency signal $V_{IN}$. A differential amplifier 41, a full-wave rectifier 51, and a comparator 61 of the frequency multiplier 10 according to the first embodiment correspond to the phase shift section 4, the waveform combining section 5, and the comparator section 6, respectively, of the frequency multiplier 1 shown in the first principle diagram. Further, a voltage bias section 71 that is connected to the two input terminals of the differential amplifier 41 corresponds to the level shift section 7. In the frequency multiplier 10 according to the first embodiment, level shifting is performed on an input frequency signal $V_{IN}$ before it is subjected to phase shifting.

The input frequency signal $V_{IN}$ is input to one input terminal of the differential amplifier 41 as a single-phase signal. A capacitance C1 as a grounding capacitance is connected to the other input terminal of the differential amplifier 41. Voltage sources VB1 and VB2 of the voltage bias section 71 are connected to the respective differential input terminals of the differential amplifier 41. The differential amplifier 41 has differential output terminals, from which differential output signals VS1+ and VS1− are output. The differential output signals VS1+ and VS1− are input to the full-wave rectifier 51 and is full-wave-rectified there. A resulting signal is output from an output terminal VM1 as a single-phase signal. The term "full-wave rectification" as used here means full-wave rectification performed by a bias circuit, etc. (not shown) by using, as a reference voltage level, the center level of the voltage range of the differential output signals VS1+ and VS1−. A full-wave-rectified signal VM1 that has been produced by the full-wave rectification by the full-wave rectifier 51 in such a manner that the differential output signals VS1+ and VS1− are "folded" approximately at the center level of their amplitude levels is input to one input terminal of the comparator 61. A reference voltage $V_{REF}$ is input to the other input terminal of the comparator 61. A comparison result of the two input signals VM1 and $V_{REF}$ is output as an output frequency signal $V_{OUT}$.

The first embodiment is directed to the case that the input frequency signal $V_{IN}$ is input to the one differential input terminal of the differential amplifier 41 as a single-phase signal. However, the invention is not limited to such a case; for example, input frequency signals $V_{IN}$ as differential signals may be input to the differential amplifier 41. In the latter case, the capacitance C1 (grounding capacitance) that is connected to the other differential input terminal is not necessary.

Figure 4:
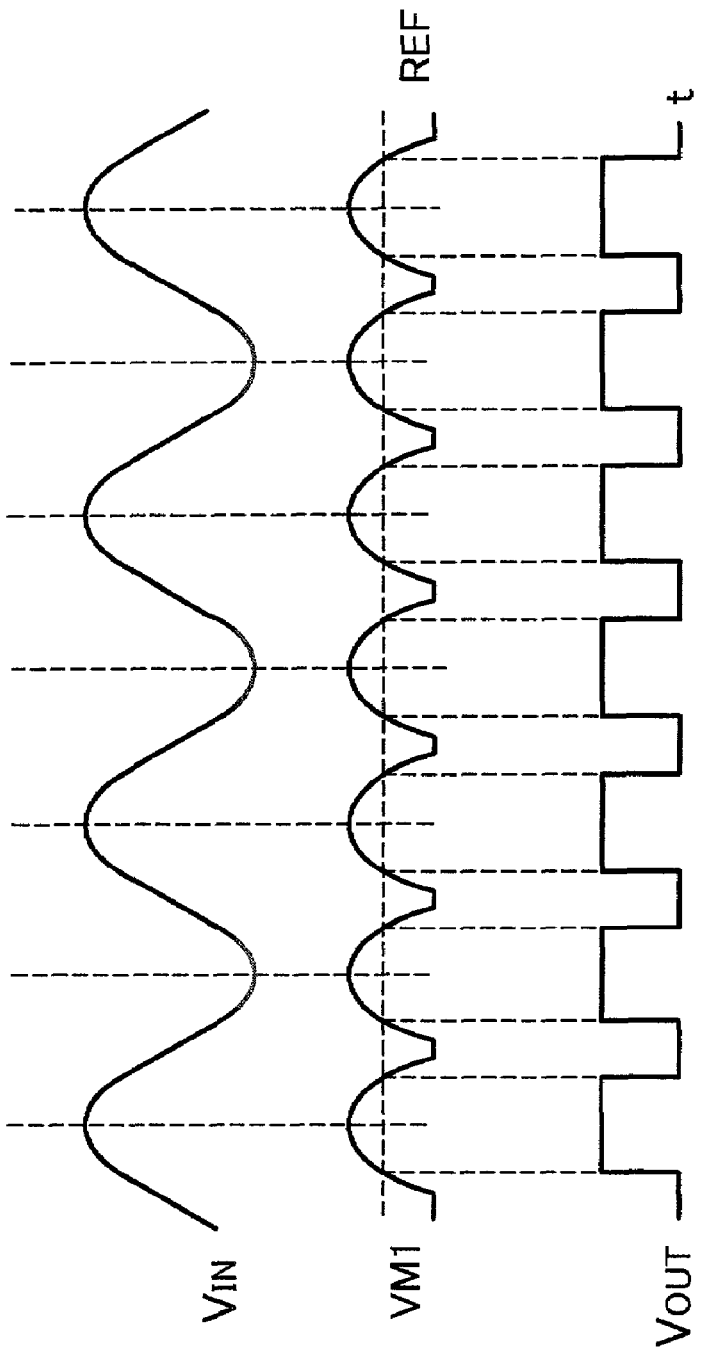
FIG. 4 shows a frequency-multiplied waveform produced by the frequency multiplier of FIG. 3.

FIG. 4 shows input-output response waveforms in a case that a sinusoidal waveform such as a sine wave is input as an input frequency signal $V_{IN}$. In the case of FIG. 4, the bias voltage values of the voltage sources VB1 and VB2 are set at the same voltage. Differential output signals VS1+ and VS1− of the differential amplifier 41 have opposite phases. A full-wave-rectified signal VM1 produced by the full-wave rectifier 51 from the differential output signals VS1+ and VS1− has such a waveform as is obtained by "folding" the differential output signals VS1+ and VS1− approximately at the center level of the amplitude levels. Therefore, the oscillation frequency is two times higher than the frequency of the input frequency signal $V_{IN}$. By setting the reference voltage $V_{REF}$ at a proper voltage level between the amplitude levels of the full-wave-rectified signal VM1, the output frequency signal $V_{OUT}$ can be made a rectangular waveform having a desired high-level period and the same frequency as the frequency of the full-wave-rectified signal VM1. The output frequency signal $V_{OUT}$ thus obtained is a rectangular waveform whose frequency is two times that of the input frequency signal $V_{IN}$.

FIG. 4 shows the input-output response waveforms in the case that the bias voltage values of the voltage sources VB1 and VB2 are set at the same voltage. An offset voltage can be set between the differential output signals VS1+ and VS1− of the differential amplifier 41 by setting a difference between the bias voltage values of the voltage sources VB1 and VB2. This makes it possible to obtain a full-wave-rectified waveform VM1 have alternate, different peak voltage values. By comparing such a full-wave-rectified waveform VM1 with the reference voltage $V_{REF}$ in the comparator 61, the output frequency signal $V_{OUT}$ becomes such that a pulse occurs every other cycle of the full-wave-rectified waveform VM1. This will be described later in a more specific example of the first embodiment.

The frequency multiplier 10 according to the first embodiment is such that differential output signals VS1+ and VS1− are input from the differential amplifier 41 to the full-wave rectifier 51 and an output frequency signal $V_{OUT}$ having a double frequency is produced. If one of differential output signals VS1+ and VS1−, rather than both, is input to the full-wave rectifier 51, an output frequency signal $V_{OUT}$ having the same frequency as the frequency of an input frequency signal $V_{IN}$ can be obtained. Therefore, the frequency of an output frequency signal $V_{OUT}$ can be switched between the frequency of an input frequency signal $V_{IN}$ and its double frequency by switching the input signals to the full-wave rectifier 51.

Figure 5:
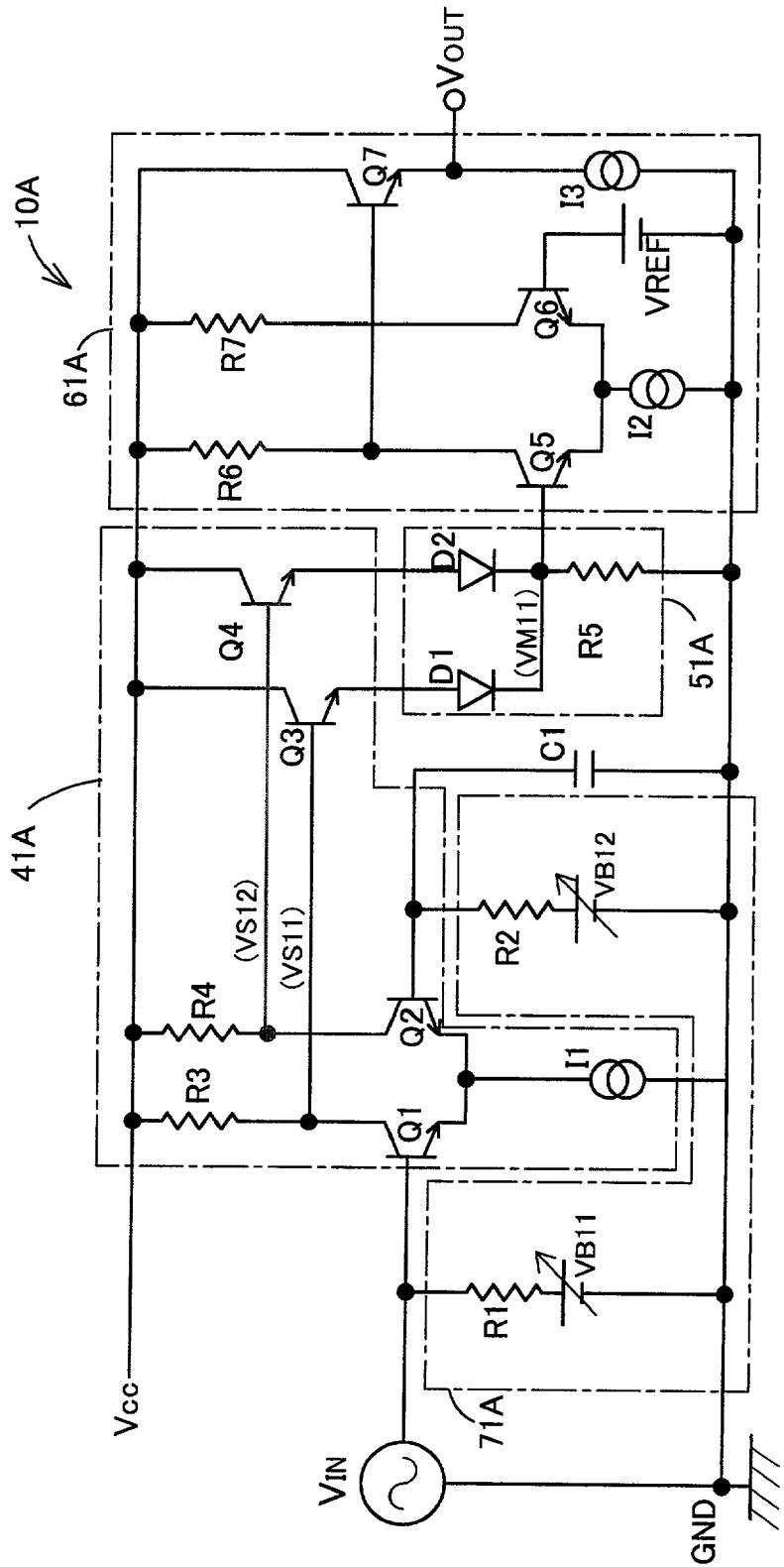
FIG. 5 is a circuit diagram of a frequency multiplier as a more specific example according to the first embodiment.

FIG. 5 is a circuit diagram of a frequency multiplier 10A as a more specific example according to the first embodiment. The frequency multiplier 10A of FIG. 5 is to switch as appropriate between an output frequency signal $V_{OUT}$ having the same frequency as the frequency of an input frequency signal $V_{IN}$ and an output frequency signal $V_{OUT}$ whose frequency is two times the frequency of the input frequency signal $V_{IN}$. Transistors Q1 and Q2 having the same conductivity type and size constitute an input differential pair.

The emitter terminal connecting point of the transistors Q1 and Q2 is connected to the ground GND (ground voltage) via a current source I1. An input frequency signal $V_{IN}$ is input to the base terminal of the transistor Q1. A capacitance C1 that is connected to the base terminal of the transistor Q2 is a grounding capacitance. Resistance elements R3 and R4 having the same characteristic and size are also connected, as loads, to the input differential pair, Q1 and Q2. The connecting points of the resistance elements R3 and R4 and the transistors Q1 and Q2, that is, differential output terminals VS11 and VS12 of the input differential pair, Q1 and Q2, are connected to the base terminals of next-stage transistors Q3 and Q4, respectively. The transistors Q3 and Q4 also have the same conductivity type and size. The transistors Q3 and Q4 constitute a emitter follower buffer circuits for receiving output signals of the input differential pair, Q1 and Q2, respectively. The transistors Q1 to Q4, the resistance elements R3 and R4, and the current source I1 constitute a differential amplifier section 41A, which is a specific example of the phase shift section 4 of the frequency multiplier 1 shown in the first principle diagram.

The base terminals of the input differential pair, Q1 and Q2 are DC-biased by voltage sources VB11 and VB12 via resistors R1 and R2, respectively. The voltage sources VB11 and VB12 and the resistors R1 and R2 constitute a voltage bias section 71A, which is a specific example of the level shift section 7 of the frequency multiplier 1 shown in the first principle diagram.

The emitter terminals of the transistors Q3 and Q4 which constitute the buffer circuit are connected to the anode terminals of diodes D1 and D2, respectively. The connecting point of the cathode terminals of the diodes D1 and D2 is connected to the ground GND via a resistance element R5 and also connected, as a full-wave rectification terminal VM11, to the next stage. The diodes D1 and D2 and the resistance element R5 constitute a full-wave rectifier section 51A, which is a specific example of the waveform combining section 5 of the frequency multiplier 1 shown in the first principle diagram.

The full-wave rectification terminal VM11 is connected to the base terminal of a transistor Q5. The transistor Q5 and a transistor Q6 that have the same conductivity type and size constitute a comparison differential pair. The emitter terminal connecting point of the transistors Q5 and Q6 is connected to the ground GND via a current source I2. A reference voltage source $V_{REF}$ whose voltage is compared, by the comparison differential pair, Q5 and Q6, with a full-wave rectification signal VM11 that is supplied from the full-wave rectification terminal VM11 is connected to the base terminal of the transistor Q6. Resistance elements R6 and R7 having the same characteristic and size are connected, as loads, to the comparison differential pair, Q5 and Q6. The connecting point of the transistor Q5 and the resistance element R6 is connected to the base terminal of a transistor Q7. The emitter terminal of the transistor Q7 is connected to the ground GND via a current source I3. The transistor Q7 and the current source I3 constitute a buffer circuit, and their connecting point serves as an output terminal $V_{OUT}$. The transistors Q5 to Q7, the resistance elements R6 and R7, the current sources I2 and I3, and the reference voltage source $V_{REF}$ constitute a comparator section 61A, which is a specific example of the comparator section 6 of the frequency multiplier 1 shown in the first principle diagram.

Figure 6:
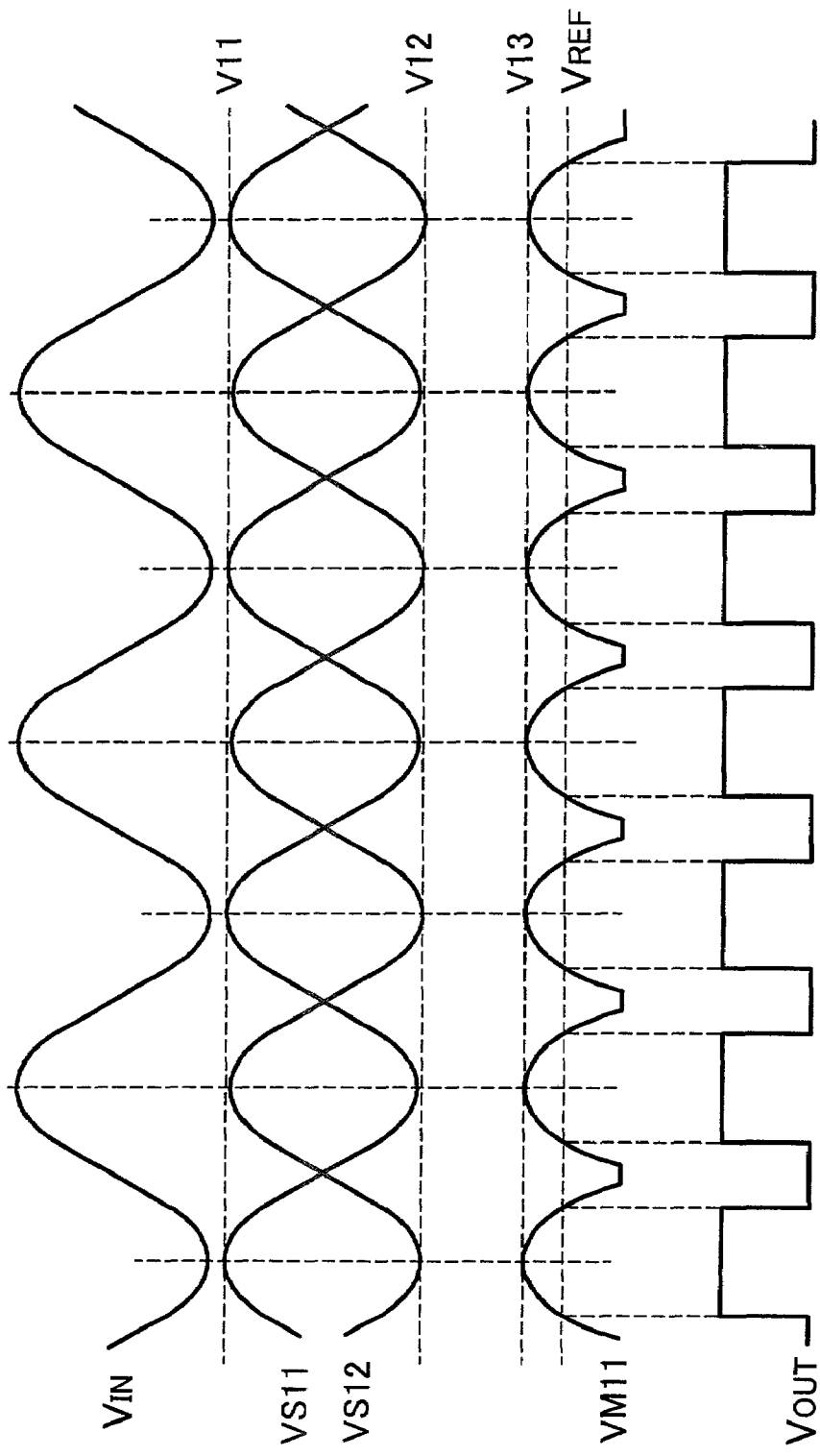
FIG. 6 shows a frequency-multiplied waveform produced by the frequency multiplier of FIG. 5 (VB11=VB12)
Figure 7:
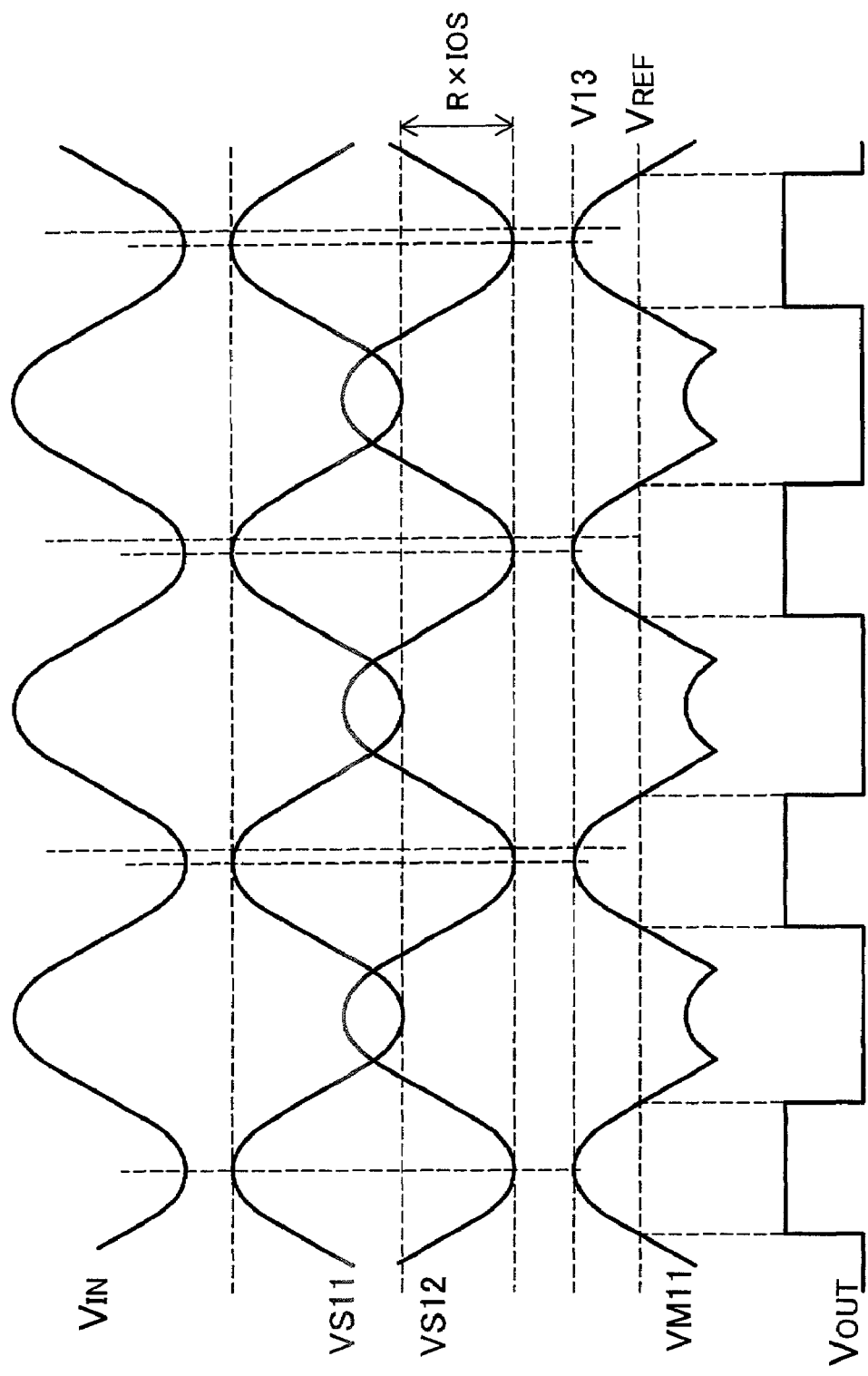
FIG. 7 shows a frequency-multiplied waveform produced by the frequency multiplier of FIG. 5 (VB11<VB12)

FIGS. 6 and 7 show input-output response waveforms in a case that a sinusoidal waveform such as a sine wave is input as an input frequency signal $V_{IN}$. FIG. 6 corresponds to a case that the voltage sources VB11 and VB12 of the voltage bias section 71A produce the same bias voltage value (voltage VB11=VB12). FIG. 7 corresponds to a case that the bias voltage value of the voltage source VB12 is higher than that of the voltage source VB11 (voltage VB11<VB12).

First, the input-output response waveforms shown in FIG. 6 will be described. In the differential amplifier section 41A, differential output signals VS11 and VS12 that are output from the differential output terminals VS11 and VS12 have opposite phases. Since the voltage sources VB11 and VB12 of the voltage bias section 71A produce the same bias voltage value (VB11=VB12), the differential output signals VS11 and VS12 have the same voltage range. Specifically, operating linearly, the input differential pair, Q1 and Q2 and produces the differential output signals VS11 and VS12 by properly allocating an output current of the current source I1 to the transistors Q1 and Q2 in accordance with the input frequency signal $V_{IN}$. A peak voltage V11 has a maximum value when none of the bias current of the current source I1 flows through the transistor Q1 or Q2, and is equal to a voltage value that is a supply voltage $V_{CC}$ minus a voltage drop across the resistance element R3 or R4 due to a current flowing through the transistor Q3 or Q4 via its base terminal. A bottom voltage V12 has a minimum value when all of the bias current of the current source I1 flows through the transistor Q1 or Q2, and is equal to a voltage value that is the supply voltage $V_{CC}$ minus a voltage drop across the resistance element R3 or R4 due to the bias current of the current source I1.

The differential output signals VS11 and VS12 that have been buffered by the transistors Q3 and Q4 are input to the anode terminals of the diodes D1 and D2, respectively. The cathode terminals of the diodes D1 and D2 are connected to each other, and the differential output signals VS11 and VS12 that are input to the anode terminals have opposite phases. The diodes D1 and D2 are turned on alternately every half cycle, that is, a diode D1 or D2 that is supplied with one of the differential output signals VS11 and VS12 having a higher voltage level is turned on. A voltage that is lowered by the base-emitter forward voltage of the transistor Q3 or Q4 and the forward voltage of the diode D1 or D2 is output at the connecting point VM11 of the cathode terminals. Therefore, one of the differential output signals VS11 and VS12 having a higher voltage level is output selectively, whereby a full-wave rectified signal VM11 having a waveform obtained by "folding" the differential output signals VS11 and VS12 approximately at the center level of the amplitude levels is output. The full-wave rectified signal VM11 have a waveform that the bottom voltage is approximately equal to the "folding" voltage value of the full-wave rectification and the peak voltage value V13 is equal to the peak voltage value V11 of the differential output signals VS11 and VS12 minus the base-emitter forward voltage of the transistor Q3 or Q4 and the forward voltage of the diode D1 or D2.

By setting the reference voltage $V_{REF}$ at a proper voltage level between the amplitude levels of the full-wave-rectified signal VM11 thus obtained, the comparator section 61A can produce an output frequency signal $V_{OUT}$ as a rectangular waveform having a desired high-level period and the same frequency as the frequency of the full-wave-rectified signal VM11. Obtained from a waveform obtained by full-wave-rectifying the input frequency signal $V_{IN}$ that is a sinusoidal waveform such as a sine wave, the output frequency signal $V_{OUT}$ is a rectangular waveform whose frequency is two times the frequency of the input frequency signal $V_{IN}$.

Next, the input-output response waveforms shown in FIG. 7 will be described. In the case of FIG. 7, the bias voltage value of the voltage source VB12 is set higher than that of the voltage source VB11 (VB11<VB12). The bias voltage difference (VB12−VB11) causes an offset current IOS between branch bias currents flowing through the transistors of the input differential pair, Q1 and Q2 under the condition that the input differential pair, Q1 and Q2 is in the linear operation range. Under the condition that the voltage difference (VB12−VB11) exists, the branch current flowing through the transistor Q2 is larger than that flowing through the transistor Q1 by the offset current IOS. Therefore, the differential output signal VS11 shifts to the high-voltage side by a voltage drop across the load resistance element R3 due to a half of the offset current IOS flowing through it from the value of the case that the voltage sources VB11 and VB12 produce the same bias voltage value (VB11=VB12). On the other hand, the differential output signal VS12 shifts to the low-voltage side by a voltage drop across the load resistance element R4 due to a half of the offset current IOS flowing through it from the value of the case that the voltage sources VB11 and VB12 produce the same bias voltage value. The voltage value difference between the differential output signals VS11 and VS12 is equal to a voltage drop (R×IOS) across the load resistance element R3 or R4 (usually, the resistance elements R3 and R4 have the same resistance value; R3=R4=R) that occurs when the offset current IOS flows through it.

One of the differential output signals VS11 and VS12 having a higher voltage level is selectively output from the diodes D1 and D2 as a full-wave-rectified signal VM11. Therefore, the full-wave-rectified signal VM11 has a waveform obtained by "folding" the differential output signals VS11 and VS12 approximately at the center level of the voltage range. The full-wave-rectified signal VM11 has a peak voltage value V13 that is equal to a peak voltage value of the differential output signal VS11 minus the base-emitter forward voltage of the transistor Q3 and the forward voltage of the diode D1. That is, the full-wave-rectified signal VM11 has a waveform in which the bottom voltage is approximately equal to the "folding" voltage value of the full-wave rectification and a large arc including a peak corresponding to the peak voltage value of the differential output signal VS11 and a small arc including a peak corresponding to the peak voltage value of the differential output signal VS12 appear alternately.

By setting the reference voltage $V_{REF}$ at a proper voltage level between the peak of the large arc corresponding to the differential output signal VS11 and the peak of the small arc corresponding to the differential output signal VS12, the comparator section 61A can produce an output frequency signal $V_{OUT}$ as a rectangular waveform whose frequency is equal to a half of the frequency of the full-wave-rectified signal VM11 and that has a desired high-level period. The output frequency signal $V_{OUT}$ thus obtained is a rectangular waveform having the same frequency as the frequency of the input frequency signal $V_{IN}$.

The above-described frequency multipliers 10 and 10A according to the first embodiment can easily switch the frequency of an output frequency signal $V_{OUT}$ between a frequency f that is the same as the frequency of an input frequency signal $V_{IN}$ and a frequency 2 f that is two times higher than the frequency f with such a simple circuit configuration that an offset voltage is set by means of the voltage bias section 71 or 71A for the basic circuit including the differential amplifier (section) 41 or 41A, the rectifier (section) 51 or 51A, and the comparator (section) 61 or 61A without the need for complex processing of selecting and extracting a prescribed frequency component from such a waveform as a rectangular wave having harmonic components. Since the rectifier (section) 51 or 51A full-wave-rectifies waveforms that are input thereto, it can easily generate a double-frequency component by cooperating with the comparator (section) 61 or 61A as a next stage. Whereas it is difficult to extract a signal having a prescribed frequency from a waveform having harmonic components because of their low signal intensity, in the first embodiment sufficient signal intensity can be secured and an output frequency signal $V_{OUT}$ having a prescribed frequency can be output reliably.

A BPF and an AMP that are necessary to extract a signal having a prescribed frequency from harmonic components are not longer necessary. Since a frequency multiplier can be realized by the simple circuit configuration including the differential amplifier (section) 41 or 41A, the rectifier (section) 51 or 51A, the comparator (section) 61 or 61A, and the voltage bias section 71 or 71A instead of a BPF and an AMP, high-density mounting and low current consumption that are indispensable for application to, for example, portable equipment such as cellular phones can be attained.

It is not necessary to accurately determine and realize characteristic values of capacitances and resistance elements for the purpose of obtaining a frequency-doubled output frequency signal $V_{OUT}$ having no distortion. Therefore, designing work is simplified and the frequency is not varied by deviations of characteristic values due to dispersion in manufacture of elements, differences in their temperature characteristics, and other factors. It becomes possible to keep producing a highly accurate output frequency signal $V_{OUT}$ in a stable manner.

As long as the reference voltage $V_{REF}$ as the comparison threshold value in the comparator (section) 61 or 61A is located between the amplitude levels of a full-wave-rectified signal VM1 or VM11, the magnitude relationship between the voltage level of the reference voltage $V_{REF}$ and that of the full-wave-rectified signal VM1 or VM11 that is output from the full-wave rectifier (section) 51 or 51A as the waveform combining section 5 can be adjusted as appropriate by changing the reference voltage $V_{REF}$, whereby the frequency of an output frequency signal $V_{OUT}$ that is output from the comparator (section) 61 or 61A can be switched to a desired value.

Since no switch circuit or the like is needed to switch the frequency of an output frequency signal $V_{OUT}$, current that is consumed conventionally for driving the switch circuit or the like no longer occurs and the current consumption in the circuit can be reduced as much.

Further, switching between the operation that both of differential output signals VS1+ and VS1− are input to the full-wave rectifier 51 and the operation that only one of those is input to the full-wave rectifier 51 provides the same effect as switching between shifting the phase of a signal and not shifting it does. In this manner, the frequency of an output frequency signal $V_{OUT}$ can be switched between the same frequency as the frequency of an input frequency signal $V_{IN}$ and its double frequency.

Figure 8:
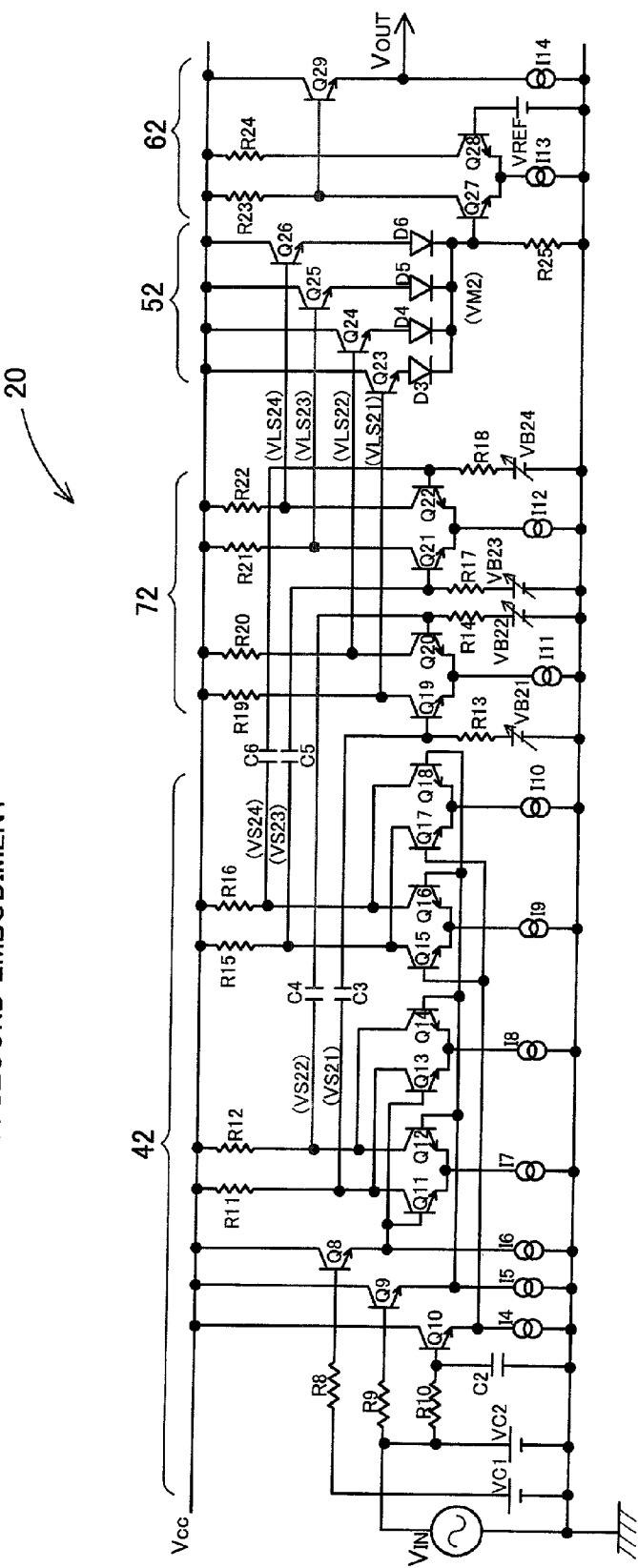
FIG. 8 is a circuit block diagram of a frequency multiplier according to a second embodiment of the invention.

FIG. 8 is a circuit diagram of a frequency multiplier 20 according to a second embodiment of the invention. The frequency multiplier 20 of FIG. 8 corresponds to the frequency multiplier 1 shown in the first principle diagram, and is to switch the frequency of the output frequency signal $V_{OUT}$ among the same frequency as the frequency of an input frequency signal $V_{IN}$ to its quadruple frequency. A phase shift section 42, a level shift section 72, a full-wave rectifier section 52, and a comparator section 62 of the frequency multiplier 20 according to the second embodiment correspond to the phase shift section 4, the level shift section 7, the waveform combining section 5, and the comparator section 6, respectively, of the frequency multiplier 1 shown in the first principle diagram.

An input frequency signal $V_{IN}$ is input, via a resistance element R9, to the base terminal of a transistor Q9 that is biased by a voltage source VC2. The emitter terminal of the transistor Q9 is connected to the ground GND (ground voltage) via a current source I5, and its collector terminal is supplied with a supply voltage $V_{CC}$. A combination of a transistor Q8 and a current source I6 and a combination of a transistor Q10 and a current source I4 each of which is arranged in the same manner as the combination of the transistor Q9 and the current source I5 are provided between the supply voltage $V_{CC}$ and the ground GND. The base terminals of the transistors Q8 and Q10 are biased by the voltage sources VC1 and VC2 via the resistance elements R8 and R10, respectively. A capacitance C2 is provided between the base terminal of the transistor Q10 and the ground GND.

The emitter terminals of the transistors Q8, Q9, and Q10 are connected to a first input differential pair, Q11 and Q12, a second input differential pair, Q13 and Q14, a third input differential pair, Q15 and Q16, and a fourth input differential pair, Q17 and Q18. Specifically, the emitter terminal of the transistor Q8 is connected to the first input differential pair transistor Q11 and the second input differential pair transistor Q13. The emitter terminal of the transistor Q9 is connected to the first input differential pair transistor Q12, the second input differential pair transistor Q14, the third input differential pair transistor Q16, and the fourth input differential pair transistor Q18. The emitter terminal of the transistor Q10 is connected to the third input differential pair transistor Q15 and the fourth input differential pair transistor Q17.

The transistors of each of the first input differential pair, Q11 and Q12 to the fourth input differential pair, Q17 and Q18 have the same conductivity type and size. Their emitter terminal connecting points are connected to the ground GND via respective current sources I7 to I10. The first input differential pair, Q11 and Q12 and the second input differential pair, Q13 and Q14 are connected to common load resistance elements, and the third input differential pair, Q15 and Q16 and the fourth input differential pair, Q17 and Q18 are also connected to common load resistance elements. More specifically, the transistors Q11 and Q13 are connected to a resistance element R11, the transistors Q12 and Q14 are connected to a resistance element R12, the transistors Q15 and Q17 are connected to a resistance element R15, and the transistors Q16 and Q18 are connected to a resistance element R16. The resistance elements R11, R12, R15, and R16 have the same characteristic and size. The input section of an input frequency signal $V_{IN}$ to the connecting points VS21, VS22, VS23, and VS24 of the load resistance elements R11, R12, R15, and R16 and the differential input pair transistors constitute the phase shift section 42.

The connecting points VS21 to VS24 are connected to one ends of capacitances C3, C4, C5, and C6, respectively. The other ends of the capacitances C3 to C6 are connected to the base terminals of transistors Q19, Q20, Q21, and Q22, respectively, and also connected to voltage sources VB21, VB22, VB23, and VB24 (connected to the ground GND) via resistance elements R13, R14, R17, and R18, respectively. Current sources I11 and I12 are connected to the emitter terminal connecting point of a first level conversion differential pair, Q19 and Q20 and a second level conversion differential pair, Q21 and Q22, respectively, and load resistance elements R19, R20, R21, and R22 are connected to their collector terminals. The capacitances C3 to C6 to the first level conversion differential pair, Q19 and Q20 and the second level conversion differential pair, Q21 and Q22 constitute the level shift section 72.

The collector terminals of the first level conversion differential pair, Q19 and Q20 and the second level conversion differential pair, Q21 and Q22 are connected, as output terminals, to the base terminals of next-stage transistors Q23, Q24, Q25, and Q26, respectively. The transistors Q23, Q24, Q25, and Q26 have the same conductivity type and size. The collector terminals of the transistors Q23, Q24, Q25, and Q26 are supplied with the supply voltage $V_{CC}$. The transistors Q23, Q24, Q25, and Q26 constitute emitter follower buffer circuits for receiving output signals of the first level conversion differential pair, Q19 and Q20 and the second level conversion differential pair, Q21 and Q22. The emitter terminals of the transistors Q23 to Q26 are connected to the anode terminals of diodes D3, D4, D5, and D6, respectively. The cathode terminal connecting point of the diodes D3 to D6 is connected to the ground GND via a resistance element R25 and also connected, as a full-wave rectification terminal VM2, to the next stage. The buffer circuit to the full-wave rectification terminal VM2 constitute the full-wave rectifier section 52.

The full-wave rectification terminal VM2 is connected to the base terminal of a transistor Q27. The transistor Q27 and a transistor Q28 have the same conductivity type and size and constitute a comparison differential pair. The emitter terminal connecting point of the transistors Q27 and Q28 is connected to the ground GND via a vias current source I13. A reference voltage source $V_{REF}$ whose voltage is compared, by the comparison differential pair, Q27 and Q28, with a full-wave rectification signal VM2 that is supplied from the full-wave rectification terminal VM2 is connected to the base terminal of the transistor Q28. Resistance elements R23 and R24 having the same characteristic and size are connected, as loads, to the comparison differential pair, Q27 and Q28. The connecting point of the transistor Q27 and the resistance element R23 is connected to the base terminal of a transistor Q29. The emitter terminal of the transistor Q29 is connected to the ground GND via a current source I14. The transistor Q29 and the current source I14 constitute a buffer circuit, and their connecting point serves as an output terminal $V_{OUT}$. The full-wave rectification terminal VM2 to the output terminal $V_{OUT}$ constitute the comparison section 62.

Figure 9:
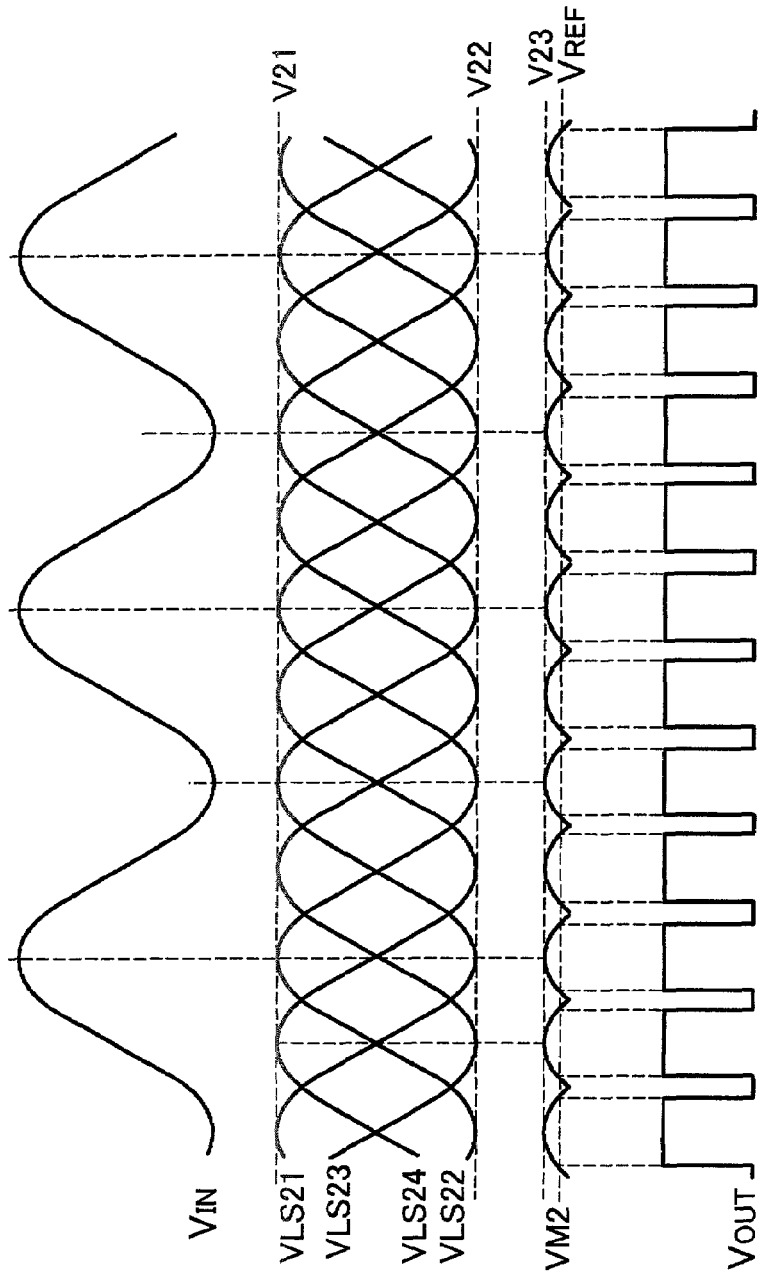
FIG. 9 shows a frequency-multiplied waveform produced by the frequency multiplier of FIG. 8 (VB21=VB22=VB23=VB24)
Figure 10:
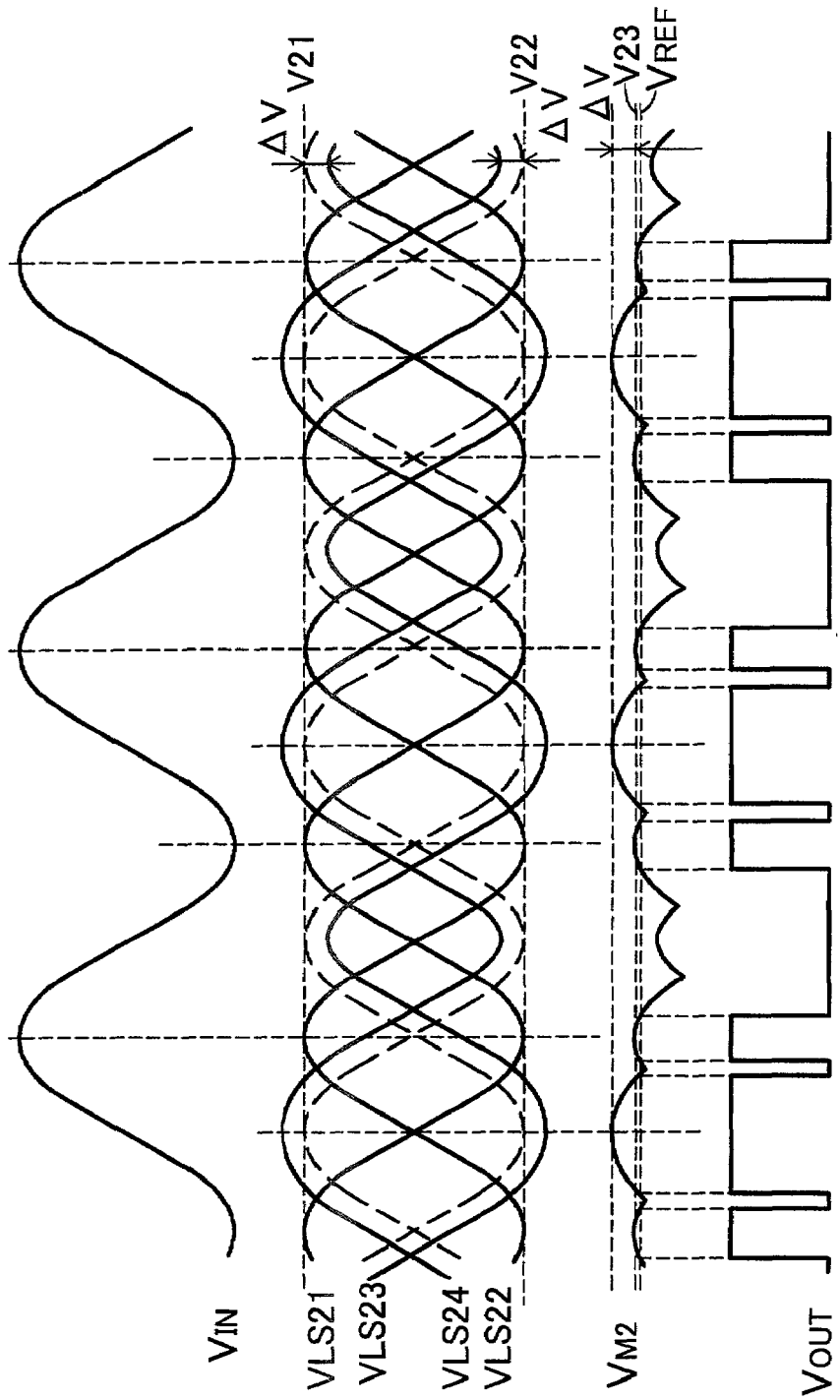
FIG. 10 shows a frequency-multiplied waveform produced by the frequency multiplier of FIG. 8 (VB21=VB22=VB24<VB23)
Figure 11:
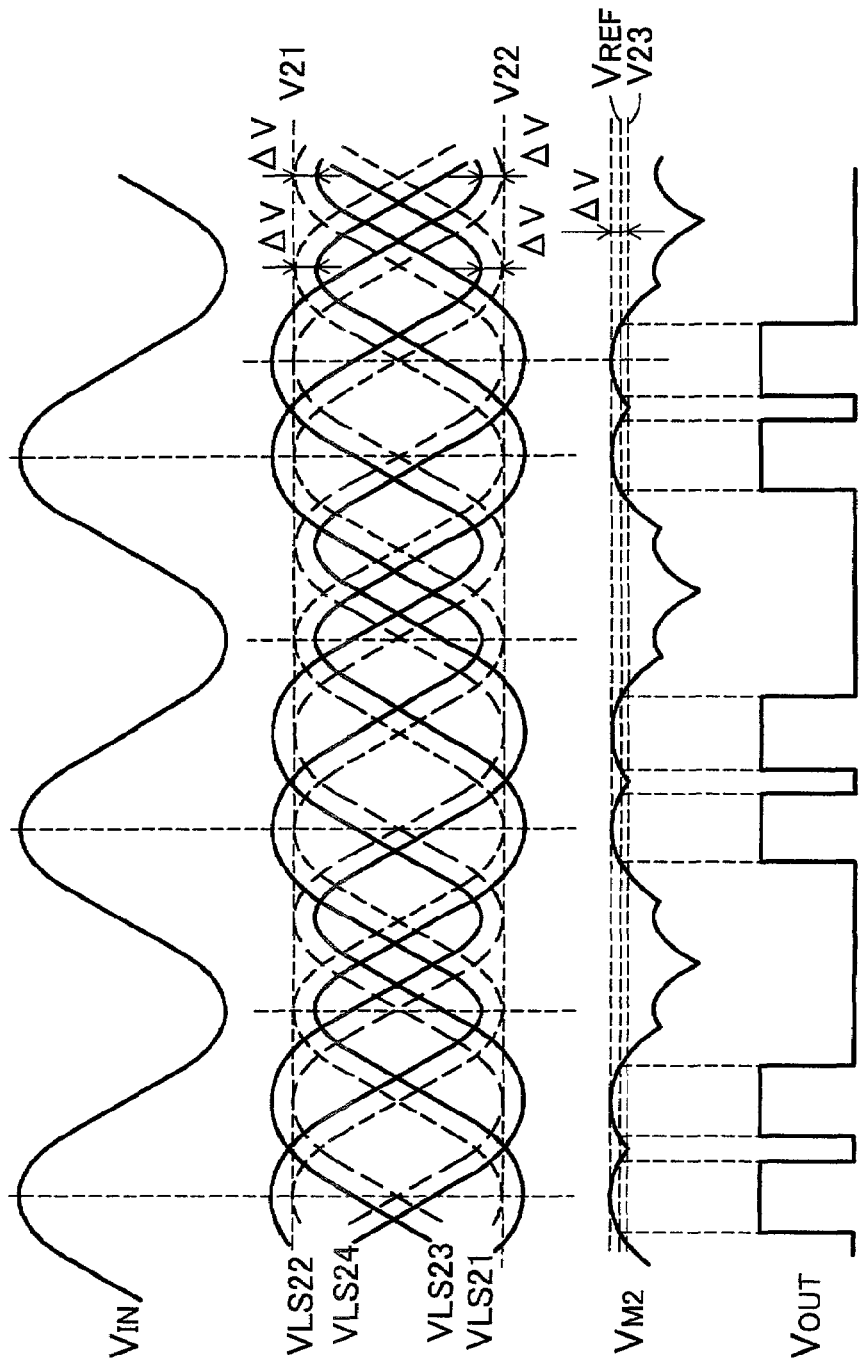
FIG. 11 shows a frequency-multiplied waveform produced by the frequency multiplier of FIG. 8 (VB21=VB24>VB22=VB23)
Figure 12:
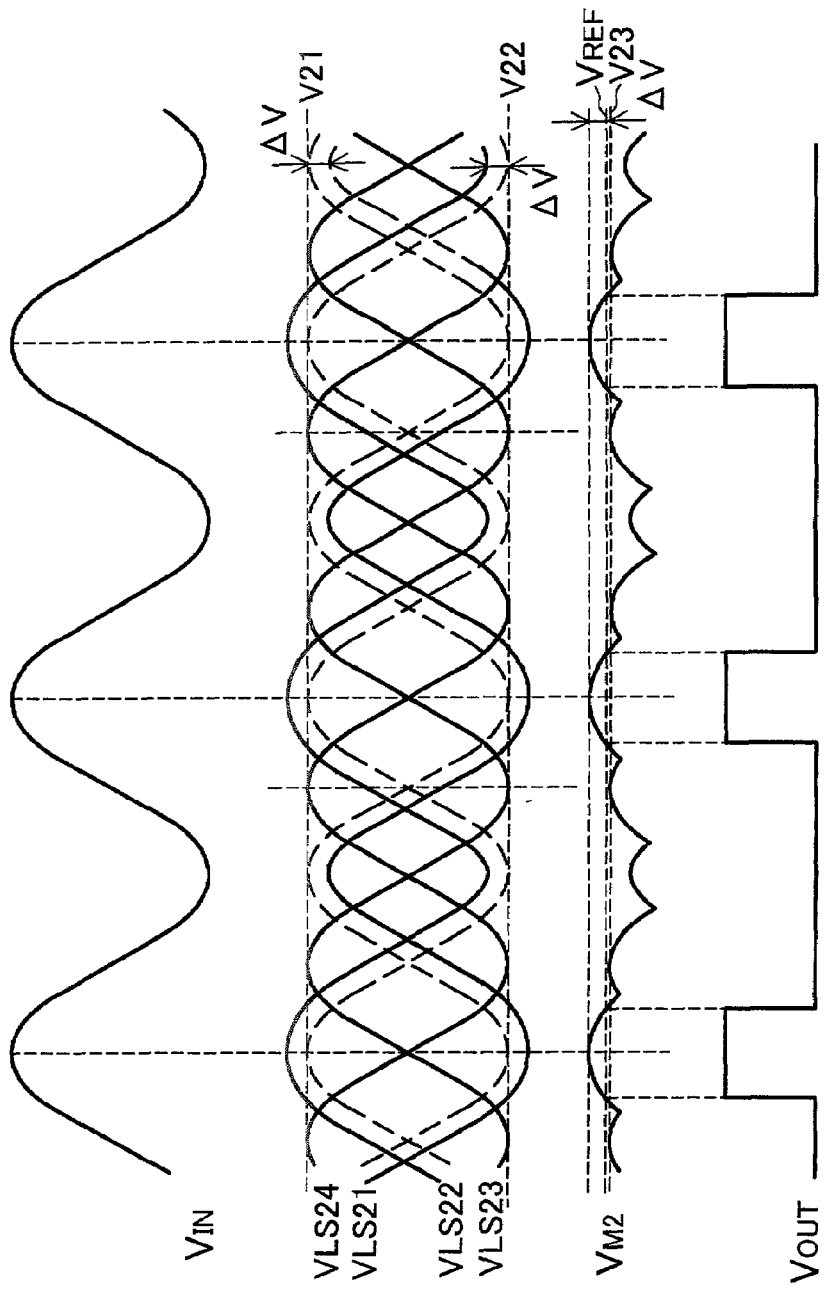
FIG. 12 shows a frequency-multiplied waveform produced by the frequency multiplier of FIG. 8 (VB21=VB23=VB24>VB22)

FIGS. 9 to 12 show input-output response waveforms in a case that a sinusoidal waveform such as a sine wave is input as an input frequency signal $V_{IN}$. FIG. 9 corresponds to a case that in the level shift section 72 the voltage sources VB21 to VB24 produce the same bias voltage value (voltage value VB21=VB22=VB23=VB24). FIG. 10 corresponds to a case that in the level shift section 72 the voltage sources VB21, VB22, and VB24 produce the same bias voltage value and the bias voltage value of the voltage source VB23 is higher than that of the voltage sources VB21, VB22, and VB24 (voltage value VB21=VB22=VB24<VB23). FIG. 11 corresponds to a case that in the level shift section 72 the voltage sources VB21 and VB24 produce the same bias voltage values, the voltage sources VB22 and VB23 produce the same bias voltage value, and the bias voltage value of the voltage sources VB21 and VB24 is higher than that of the voltage sources VB22 and VB23 (voltage value VB21=VB24>VB22=VB23). FIG. 12 corresponds to a case that in the level shift section 72 the voltage sources VB21, VB23, and VB24 produce the same bias voltage value and the bias voltage value of the voltage source VB22 is lower than that of the voltage sources VB21, VB23, and VB24 (voltage value VB21=VB23=VB24>VB22). The individual cases will be described below.

First, the input-output response waveforms shown in FIG. 9 will be described. Signals that are output from the emitter terminals of the respective transistors Q8 to Q10 that constitute the input stage of the phase shift section 42 are as follows. The signal that is output from the emitter terminal of the transistor Q8 has a fixed value that is equal to the bias voltage of the voltage source VC1 minus the base-emitter forward voltage of the transistor Q8. The signal that is output from the emitter terminal of the transistor Q9 is a signal that is in phase with the input frequency signal $V_{IN}$ and has, as the center voltage, a voltage that is the bias voltage of the voltage source VC2 minus the base-emitter forward voltage of the transistor Q9. The signal that is output from the emitter terminal of the transistor Q10 is a signal that is phase-delayed from the input frequency signal $V_{IN}$ by 90° by the resistance element R10 and the capacitance C2 and has, as the center voltage, a voltage that is the bias voltage of the voltage source VC3 minus the base-emitter forward voltage of the transistor Q10.

The emitter terminal of the transistor Q9 is connected to the first differential pair, Q11 and Q12 to the fourth differential pair, Q17 and Q18. Therefore, differential amplified signals of the signal that is output from the emitter terminal of the transistor Q9 and is in phase with the input frequency signal $V_{IN}$ and the fixed signal that is output from the emitter terminal of the transistor Q8 or the signal that is output from the emitter terminal of the transistor Q10 and phase-delayed from the input frequency signal $V_{IN}$ by 90° are output from each of the first differential pair, Q11 and Q12 to the fourth differential pair, Q17 and Q18.

More specifically, since the signal that is in phase with the input frequency signal $V_{IN}$ and the fixed signal are input to the first differential pair, Q11 and Q12 and the second differential pair, Q13 and Q14, a differential output signal VS22 has an inverted phase (phase: 180°) if the phase of a differential output signal VS21 is employed as a reference (phase: 0°). In contrast, the signal that is phase-delayed from the input frequency signal $V_{IN}$ by 90° is input to the base terminal of the transistor Q15 of the third differential pair, Q15 and Q16 and the base terminal of the transistor Q17 of the fourth differential pair, Q17 and Q18. Since inverted phases appear at the output terminals of a differential pair, a differential output signal VS23 that is phase-delayed by 270° (phase: 270°) is obtained at the collector terminal of the transistor Q15 and Q17 and a differential output signal VS24 that is inverted in phase (phase: 90°) from the differential output signal VS24 is obtained at the collector terminal of the transistor Q16 and Q18. If the current sources I7 to I10 produce the same bias current value, since the load resistance elements R11, R12, R15, and R16 have the same resistance value, the differential output signals VS21 to VS24 have the same peak/bottom voltage value as in the case of the frequency multiplier 10A of the specific example according to the first embodiment.

Then, the differential output signals VS21 to VS24 are level-shifted. To this end, the differential output signals VS21 to VS24 are input to the base terminals of the transistors of the first level conversion differential pair, Q19 and Q20 and the second level conversion differential pair, Q21 and Q22 after their DC components are cut by the respective capacitances C3 to C6. The base terminals of the transistors of the first level conversion differential pair, Q19 and Q20 and the second level conversion differential pair, Q21 and Q22 are also connected to the voltage sources VB21 to VB24 via the resistance elements R13, R14, R17, and R18, whereby bias voltages are set. In the case of FIG. 9, the voltage sources VB21 to VB24 produce the same bias voltage value (voltage value VB21=VB22=VB23=VB24). Therefore, no offset occurs between the input signals to the base terminals of the transistors of the first level conversion differential pair, Q19 and Q20 and the second level conversion differential pair, Q21 and Q22.

The four-phase differential output signals VS21 to VS24 that have been phase-shifted from each other by 90° by the phase shift section 42 (phase: VS21=0°; VS22=180°; VS23=270°; and VS24=90°) are level-shifted by the first level conversion differential pair, Q19 and Q20 and the second level conversion differential pair, Q21 and Q22, and then input, as level shift signals VLS21, VLS22, VLS23, and VLS24, to the base terminals of the transistors Q23 to Q26 that constitute the buffer circuit of the full-wave rectifier section 52. Since the phases are inverted by the first level conversion differential pair, Q19 and Q20 and the second level conversion differential pair, Q21 and Q22, the level shift signals VLS21, VLS22, VLS23, and VLS24 have respective phases of 180°, 0°, 90°, and 270° when the phase of the differential output signal VS21 is used as a reference. The amplitude levels are determined by the current sources I11 and I12 and the load resistance elements R19 to R22. Receiving the four-phase signals that are deviated from each other in phase by 90°, the diodes D3 to D6 perform rectification in such a manner as to trace one of the waveforms of the four-phase signals having a highest voltage value and thereby produces a full-wave-rectified waveform VM2. The full-wave-rectified waveform VM2 has a bottom voltage value that is approximately equal to the intersecting voltage of the four-phase waveforms minus the base-emitter forward voltage of one of the transistors Q23 to Q26 and the forward voltage of one of the diodes D3 to D6 and a peak voltage value V23 that is equal to a peak value of the voltages output from the first level conversion differential pair, Q19 and Q20 and the second level conversion differential pair, Q21 and Q22 minus the base-emitter forward voltage of one of the transistors Q23 to Q26 and the forward voltage of one of the diodes D3 to D6.

It goes without saying that the first input differential pair, Q11 and Q12 to the fourth input differential pair, Q17 and Q18 and the first level conversion differential pair, Q19 and Q20 and the second level conversion differential pair, Q21 and Q22 operate linearly. The maximum value of the peak voltage value and the minimum value of the bottom voltage value of each differential pair are the same as described in the first embodiment.

By setting the reference voltage $V_{REF}$ at a proper voltage level between the amplitude levels of the full-wave-rectified signal VM2 thus obtained, the comparator section 62 can produce an output frequency signal $V_{OUT}$ as a rectangular waveform whose frequency is equal to the frequency of the full-wave-rectified signal VM2 and that has a desired high-level period, as in the case of the first embodiment. The output frequency signal $V_{OUT}$ thus obtained is a rectangular waveform whose frequency is four times higher than the frequency of an input frequency signal $V_{IN}$ that is a sinusoidal waveform such as a sine wave.

Next, the input-output response waveforms shown in FIG. 10 will be described. The basic circuit operation is the same as described above with reference to FIG. 9 and hence will not be described. The only condition that is different than in the case of FIG. 9 that the bias voltage value of the voltage source VB23 is higher than that of the other voltage sources VB21, VB22, and VB24 (voltage value: VB21=VB22=VB24<VB23). Therefore, among the level shift signals VLS21, VLS22, VLS23, and VLS24, the amplitude levels of the signal VLS23 that is output from the transistor Q21 that is biased by the voltage source VB23 are shifted downward.

Since the bias voltage value of the voltage source VB23 is set higher than that of the other voltage sources VB21, VB22, and VB24 (voltage value: VB21=VB22=VB24<VB23), an offset current IOS occurs between branch bias currents flowing through the transistors of the second level conversion differential pair, Q21 and Q22 under the condition that the bias voltage difference (VB23−VB24) is in the linear operation range of the second level conversion differential pair, Q21 and Q22. Under the condition that the voltage difference VB23−VB24 exists, the branch current flowing through the transistor Q21 is larger than that flowing through the transistor Q22 by the offset current IOS. Therefore, the differential output signal VLS24 shifts to the high-voltage side by a voltage drop across the load resistance element R22 due to a half of the offset current IOS flowing through it from the value of the case that the voltage sources VB23 and VB24 produce the same bias voltage value (voltage value: VB23=VB24). On the other hand, the differential output signal VLS23 shifts to the low-voltage side by a voltage drop across the load resistance element R21 due to a half of the offset current IOS flowing through it from the value of the case that the voltage sources VB23 and VB24 produce the same bias voltage value. The shift amount ΔV of each of the differential output signals VLS23 and VLS24 is equal to a voltage drop (R×IOS)/2 across the load resistance element R21 or R22 (usually, the resistance elements R21 and R22 have the same resistance value; R21=R22=R) that occurs when a half of the offset current IOS flows through it.

Among the four-phase level shift signals VLS21 to VLS24 that are deviated from each other in phase by 90°, the level shift signal VLS23 shifts to the low-voltage side by the amount ΔV. By making adjustments so that the peak voltage value of the level shift signal VLS23 as shifted by the amount ΔV minus the voltage drops across the transistor Q25, the diode D5, etc. is lower than the reference voltage $V_{REF}$, the diode D5, etc. becomes lower than the reference voltage $V_{REF}$, for the level shift signal VLS23 no inversion occurs in the output frequency signal $V_{OUT}$ in the comparator section 62. A full-wave-rectified signal VM2 is obtained based on the level shift signal VLS24 having a high peak voltage and the level shift signal VLS23 having a low peak voltage. The full-wave-rectified waveform VM2 has a bottom voltage value that is approximately equal to the intersecting voltage of the four-phase waveforms minus the base-emitter forward voltage of one of the transistors Q23 to Q26 and the forward voltage of one of the diodes D3 to D6 and a peak voltage value that is obtained by adding the shift amount ΔV of the level shift signal VLS24 to a voltage value V23 that is equal to a peak value of the voltages output from the first level conversion differential pair, Q19 and Q20 and the second level conversion differential pair, Q21 and Q22 minus the base-emitter forward voltage of the transistor Q23 or Q24 and the forward voltage of the diode D3 or D4.

It goes without saying that the second level conversion differential pair, Q21 and Q22 in which the voltages at the input terminals have the difference operates linearly like the other differential pairs. The maximum value of the peak voltage value and the minimum value of the bottom voltage value of each differential pair are the same as described in the first embodiment.

It is the same as in the first embodiment that the comparator section 62 can produce an output frequency signal $V_{OUT}$ that is a rectangular waveform that is inverted with a desired high-level period in portions of the thus-obtained full-wave-rectified signal VM2 corresponding to the level shift signals VLS21, VLS22, and VLS24 that exclude the level shift signal VLS23. Therefore, the output frequency signal $V_{OUT}$ thus obtained is a rectangular waveform whose frequency is three times higher than the frequency of an input frequency signal $V_{IN}$ that is a sinusoidal waveform such as a sine wave.

Next, the input-output response waveforms shown in FIG. 11 will be described. The basic circuit operation is the same as described above with reference to FIG. 9 and hence will not be described. The only condition that is different than in the case of FIG. 9 that the voltage sources VB21 and VB24 produce the same bias voltage value, the voltage sources VB22 and VB23 produce the same bias voltage value, and the bias voltage value of the voltage sources VB21 and VB24 is higher than that of the voltage sources VB22 and VB23 (voltage value: VB21=VB24>VB22=VB23). Therefore, among the level shift signals VLS21 to VLS24, the amplitude levels of the signals VLS21 and VLS24 that are output from the transistors Q19 and Q22 that are biased by the voltage source VB21 and VB24, respectively, are shifted downward.

Since the bias voltage value of the voltage sources VB21 and VB24 is set higher than that of the voltage sources VB22 and VB23 (voltage value: VB21=VB24>VB22=VB23), an offset current IOS occurs between branch bias currents flowing through the transistors of the first level conversion differential pair, Q19 and Q20 and between branch bias currents flowing through the transistors of the second level conversion differential pair, Q21 and Q22 under the condition that the bias voltage difference (VB21−VB22, VB24−VB23) is in the linear operation range of the first level conversion differential pair, Q19 and Q20 and the second level conversion differential pair, Q21 and Q22. Under the condition that the voltage differences VB21−VB22 and VB24−VB23 exist, the branch current flowing through the transistor Q19 is larger than that flowing through the transistor Q20 by the offset current IOS and the branch current flowing through the transistor Q22 is larger than that flowing through the transistor Q21 by the offset current IOS. Therefore, the differential output signal VLS22 shifts to the high-voltage side by a voltage drop across the load resistance element R20 due to a half of the offset current IOS flowing through it from the value of the case that the voltage sources VB21 and VB22 for the first level conversion differential pair, Q19 and Q20 produce the same bias voltage value (VB21=VB22), and the differential output signal VLS23 shifts to the high-voltage side by a voltage drop across the load resistance element R21 due to a half of the offset current IOS flowing through it from the value of the case that the voltage sources VB23 and VB24 for the second level conversion differential pair Q21 and Q22 produce the same bias voltage value (VB23=VB24). On the other hand, the differential output signal VLS21 shifts to the low-voltage side by a voltage drop across the load resistance element R19 due to a half of the offset current IOS flowing through it from the value of the case that the voltage sources VB21 and VB22 for the first level conversion differential pair, Q19 and Q20 produce the same bias voltage value (VB21=VB22), and the differential output signal VLS24 shifts to the low-voltage side by a voltage drop across the load resistance element R22 due to a half of the offset current IOS flowing through it from the value of the case that the voltage sources VB23 and VB24 for the second level conversion differential pair Q21 and Q22 produce the same bias voltage value (VB23=VB24). The shift amount ΔV to the high-voltage side of each of the differential output signals VLS22 and VLS23 and the shift amount ΔV to the low-voltage side of each of the differential output signals VLS21 and VLS24 is equal to a voltage drop (R×IOS)/2 across the load resistance element R20, R21, R19, or R22 (usually, the resistance elements R19 to R22 have the same resistance value; R19=R20=R21=R22=R) that occurs when a half of the offset current IOS flows through it.

Among the four-phase level shift signals VLS21 to VLS24 that are deviated from each other in phase by 90°, the level shift signals VLS21 and VLS24 shift to the low-voltage side by the amount ΔV. On the other hand, the level shift signals VLS22 and VLS23 shift to the high-voltage side by the amount ΔV. By making adjustments so that the reference voltage $V_{REF}$ is set between the peak voltage value of the level shift signals VLS21 and VLS24 as shifted by the amount ΔV minus the voltage drops across the transistor Q23 or Q26, the diode D3 or D6, etc. and that of the level shift signals VLS22 and VLS23 as shifted by the amount ΔV minus the voltage drops across the transistor Q24 or Q25, the diode D4 or D5, etc., for the level shift signals VLS21 and VLS24, no inversion occurs in the output frequency signal $V_{OUT}$ in the comparator section 62. A four-phase full-wave-rectified signal VM2 is obtained based on the level shift signals VLS22 and VLS23 having a high peak voltage and the level shift signals VLS21 and VLS24 having a low peak voltage. The full-wave-rectified waveform VM2 has a bottom voltage value that is approximately equal to the intersecting voltage of the four-phase waveforms minus the base-emitter forward voltage of one of the transistors Q23 to Q26 and the forward voltage of one of the diodes D3 to D6 and a peak voltage value that is obtained by adding the shift amount ΔV of the level shift signals VLS22 and VLS23 to a voltage value V23 that is equal to a peak value of the voltages output from the first level conversion differential pair, Q19 and Q20 and the second level conversion differential pair, Q21 and Q22 when the voltage sources VB21 to VB24 have no offset minus the base-emitter forward voltage of the transistors Q23 to Q26 and the forward voltage of the diodes D3 to D6.

It goes without saying that the first level conversion differential pair, Q19 and Q20 and the second level conversion differential pair, Q21 and Q22 in which the voltages at the input terminals have the difference operate linearly like the other differential pairs. The maximum value of the peak voltage value and the minimum value of the bottom voltage value of each differential pair are the same as described in the first embodiment.

It is the same as in the first embodiment that the comparator section 62 can produce an output frequency signal $V_{OUT}$ that is a rectangular waveform that is inverted with a desired high-level period in portions of the thus-obtained full-wave-rectified signal VM2 corresponding to the level shift signals VLS22 and VLS23. Therefore, the output frequency signal $V_{OUT}$ thus obtained is a rectangular waveform whose frequency is two times higher than the frequency of an input frequency signal $V_{IN}$ that is a sinusoidal waveform such as a sine wave.

Next, the input-output response waveforms shown in FIG. 12 will be described. The basic circuit operation is the same as described above with reference to FIG. 9 and hence will not be described. The only condition that is different than in the case of FIG. 9 that the voltage sources VB21, VB23, and VB24 produce the same bias voltage value and the bias voltage value of the voltage source VB22 is lower than that of the voltage sources VB21, VB23, and VB24 (voltage value: VB21=VB23=VB24>VB22). Therefore, among the level shift signals VLS21, VLS22, VLS23, and VLS24, the amplitude levels of the signal VLS22 that is output from the transistor Q20 that is biased by the voltage source VB22 are shifted upward.

Since the bias voltage value of the voltage source VB21 is set higher than that of the other voltage sources VB22 (voltage value: VB21>VB22), an offset current IOS occurs between branch bias currents flowing through the transistors of the first level conversion differential pair, Q19 and Q20 under the condition that the bias voltage difference (VB21−VB22) is in the linear operation range of the first level conversion differential pair, Q19 and Q20. Under the condition that the voltage difference (VB21−VB22) exists, the branch current flowing through the transistor Q19 is larger than that flowing through the transistor Q20 by the offset current IOS. Therefore, the differential output signal VLS22 shifts to the high-voltage side by a voltage drop across the load resistance element R20 due to a half of the offset current IOS flowing through it from the value of the case that the voltage sources VB21 and VB22 for the first level conversion differential pair, Q19 and Q20 produce the same bias voltage value (VB21=VB22). On the other hand, the differential output signal VLS21 shifts to the low-voltage side by a voltage drop across the load resistance element R19 due to a half of the offset current IOS flowing through it from the value of the case that the voltage sources VB21 and VB22 produce the same bias voltage value. The shift amount $\Delta V$ to the high-voltage side of the differential output signals VLS22 and the shift amount $\Delta V$ to the low-voltage side of the differential output signals VLS21 are equal to a voltage drop (R×IOS)/2 across the load resistance element R20 or R19 (usually, the resistance elements R19 and R20 have the same resistance value; R19=R20=R) that occurs when a half of the offset current IOS flows through it.

Among the four-phase level shift signals VLS21 to VLS24 that are deviated from each other in phase by 90°, the level shift signal VLS21 shifts to the low-voltage side by the amount $\Delta V$ and the level shift signal VLS22 shifts to the high-voltage side by amount $\Delta V$. No voltage shift occurs in the level shift signals VLS23 and VLS24. By making adjustments so that the peak voltage value of only the level shift signal VLS22 as shifted by the amount $\Delta V$ minus the voltage drops across the transistor Q24, the diode D4, etc. exceeds the reference voltage $V_{REF}$, for the level shift signals VLS21, VLS23, and VLS24, i.e., other than the level shift signal VLS22, no inversion occurs in the output frequency signal $V_{OUT}$ in the comparator section 62. A four-phase full-wave-rectified signal VM2 is obtained based on only the level shift signal VLS22 having a high peak voltage and the level shift signal VLS21 having a low peak voltage. The full-wave-rectified waveform VM2 has a bottom voltage value that is approximately equal to the intersecting voltage of the four-phase waveforms minus the base-emitter forward voltage of one of the transistors Q23 to Q26 and the forward voltage of one of the diodes D3 to D6 and a peak voltage value that is obtained by adding the shift amount $\Delta V$ of the level shift signal VLS22 to a voltage value V23 that is equal to a peak value of the voltages output from the first level conversion differential pair, Q19 and Q20 and the second level conversion differential pair, Q21 and Q22 when the voltage sources VB21 to VB24 have no offset minus the base-emitter forward voltage of the transistors Q23 to Q26 and the forward voltage of the diodes D3 to D6.

It goes without saying that the first level conversion differential pair, Q19 and Q20 in which the voltages at the input terminals have the difference operates linearly like the other differential pairs. The maximum value of the peak voltage value and the minimum value of the bottom voltage value of each differential pair are the same as described in the first embodiment.

It is the same as in the first embodiment that the comparator section 62 can produce an output frequency signal $V_{OUT}$ that is a rectangular waveform that is inverted with a desired high-level period in portions of the thus-obtained full-wave-rectified signal VM2 corresponding to the level shift signal VLS22. Therefore, the output frequency signal $V_{OUT}$ thus obtained is a rectangular waveform whose frequency is the same as the frequency of an input frequency signal $V_{IN}$ that is a sinusoidal waveform such as a sine wave.

The above-described frequency multiplier 20 according to the second embodiment provides the following advantages in addition to the advantages of the frequency multipliers 10 and 10A according to the first embodiment. The frequency multiplier 20 can easily switch the frequency of an output frequency signal $V_{OUT}$ among a frequency f that is the same as the frequency of an input frequency signal $V_{IN}$ and frequency 2f, 3f, and 4f that are two times, three times, and four times higher than the frequency f with such a simple circuit configuration that an offset voltage is set independently in level shift signals VLS21, VLS22, VLS23, and VLS24 by means of the level shift section 72 and their amplitude levels are thereby adjusted for the basic circuit including the phase shift section 42, the full-wave rectifier section 52, and the comparator section 62 without the need for complex processing of selecting and extracting a prescribed frequency component from such a waveform as a rectangular wave having harmonic components. Since the full-wave-rectification of waveforms that are input thereto is carried out by the full-wave rectifiers 51 and 52, it can easily generate a double frequency component by cooperating with the comparator section 62 of next-stage. Whereas it is difficult to extract a signal having a prescribed frequency from a waveform having harmonic components because of their low signal intensity, in the second embodiment sufficient signal intensity can be secured and an output frequency signal $V_{OUT}$ having a prescribed frequency can be output reliably.

By constructing a phase advancing section or a phase delaying section in such a manner that it includes a capacitive load element or a inductive load element like the capacitance C2 in the phase shift section 42 functioning as the phase delaying section, phase shifting can easily performed on an input frequency signal $V_{IN}$ that is a fundamental signal.

Since the switching of the multiplication number of the frequency of an output frequency signal $V_{OUT}$ can be realized by the simple circuit configuration including the phase shift section 42, the full-wave rectifier section 52, the level shift section 72, and the comparator section 62 that set an offset independently in level shift signals VLS21 to VLS24 and thereby adjust their amplitude levels instead of a BPF, an AMP, etc. that are necessary to extract a signal having a prescribed frequency from harmonic components, high-density mounting and low current consumption that are indispensable for application to portable equipment such as cellular phones can be attained.

It is not necessary to accurately realize characteristic values of capacitance elements, resistance elements, etc. for the purpose of obtaining a frequency-doubled, tripled, or quadrupled output frequency signal $V_{OUT}$ having no distortion. Therefore, designing work is simplified and the frequency is not varied by deviations of element characteristic values due to dispersion in manufacture of elements, differences in their temperature characteristics, and other factors. It becomes possible to keep producing a highly accurate output frequency signal $V_{OUT}$ in a stable manner.

Further, since no switch circuit or the like is needed to switch the frequency of an output frequency signal $V_{OUT}$, current that is consumed conventionally for driving the switch circuit or the like no longer occurs and the current consumption in the circuit can be reduced as much.

Figure 13:
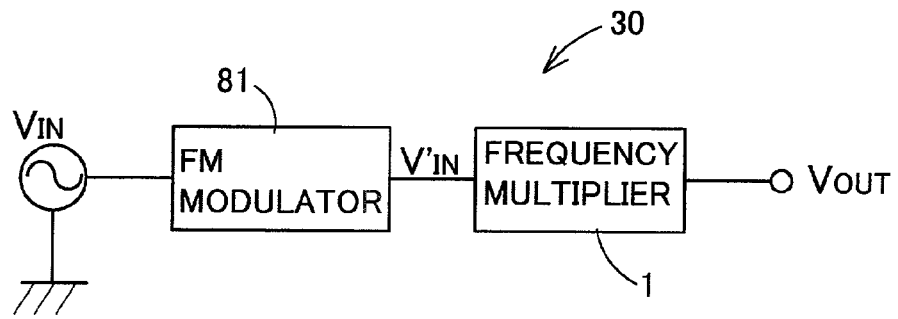
FIG. 13 is a circuit block diagram of a frequency multiplier according to a third embodiment of the invention.

FIG. 13 shows a frequency multiplier 30 according to the third embodiment of the invention, in which an FM modulator 81 is disposed preceding stage of the frequency multiplier 1 shown in the first principle diagram. In the frequency multiplier 30 according to the third embodiment, the FM modulator 81 corresponds to the modulation section 8 of the frequency multiplier 2 shown in the second principle diagram. As for specific examples of the frequency multiplier 1, it may be the frequency multiplier 10 or 10A according to the first embodiment or the frequency multiplier 20 according to the second embodiment. A signal obtained by frequency-modulating an original input frequency signal $V_{IN}$ with the FM modulator 81 is input to the frequency multiplier 10, 10A, or 20 as an input signal $V'_{IN}$.

With this configuration, the conversion into an arbitrary frequency can be performed by the FM modulator 81 in addition to the frequency multiplication by the frequency multiplier 10, 10A, or 20. Therefore, an output frequency signal $V_{OUT}$ can be produced by switching among signals having arbitrary frequencies. If this embodiment is applied to a case that an input frequency signal $V_{IN}$ has a particular frequency, frequency modulation can be performed on the input frequency signal $V_{IN}$.

Figure 14:
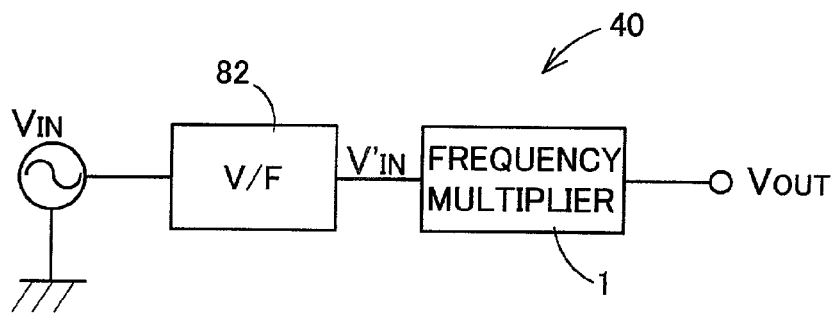
FIG. 14 is a circuit block diagram of a frequency multiplier according to a fourth embodiment of the invention.
Figure 15:
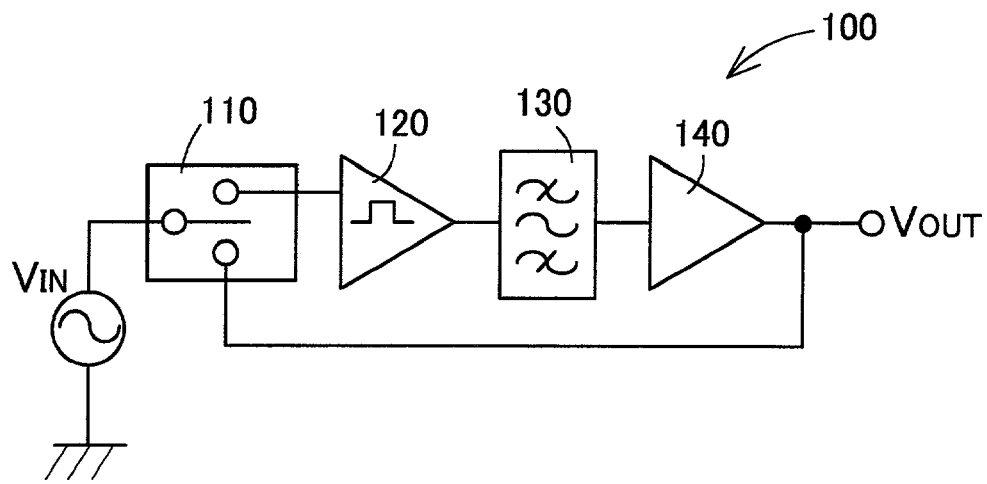
FIG. 15 is a circuit block diagram of a frequency multiplier according to a first conventional technique.
Figure 16:
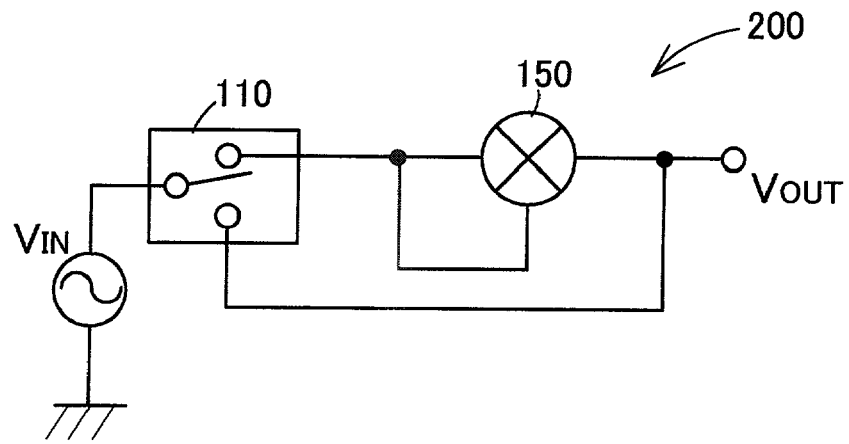
FIG. 16 is a circuit block diagram of a frequency multiplier according to a second conventional technique.
Figure 17:
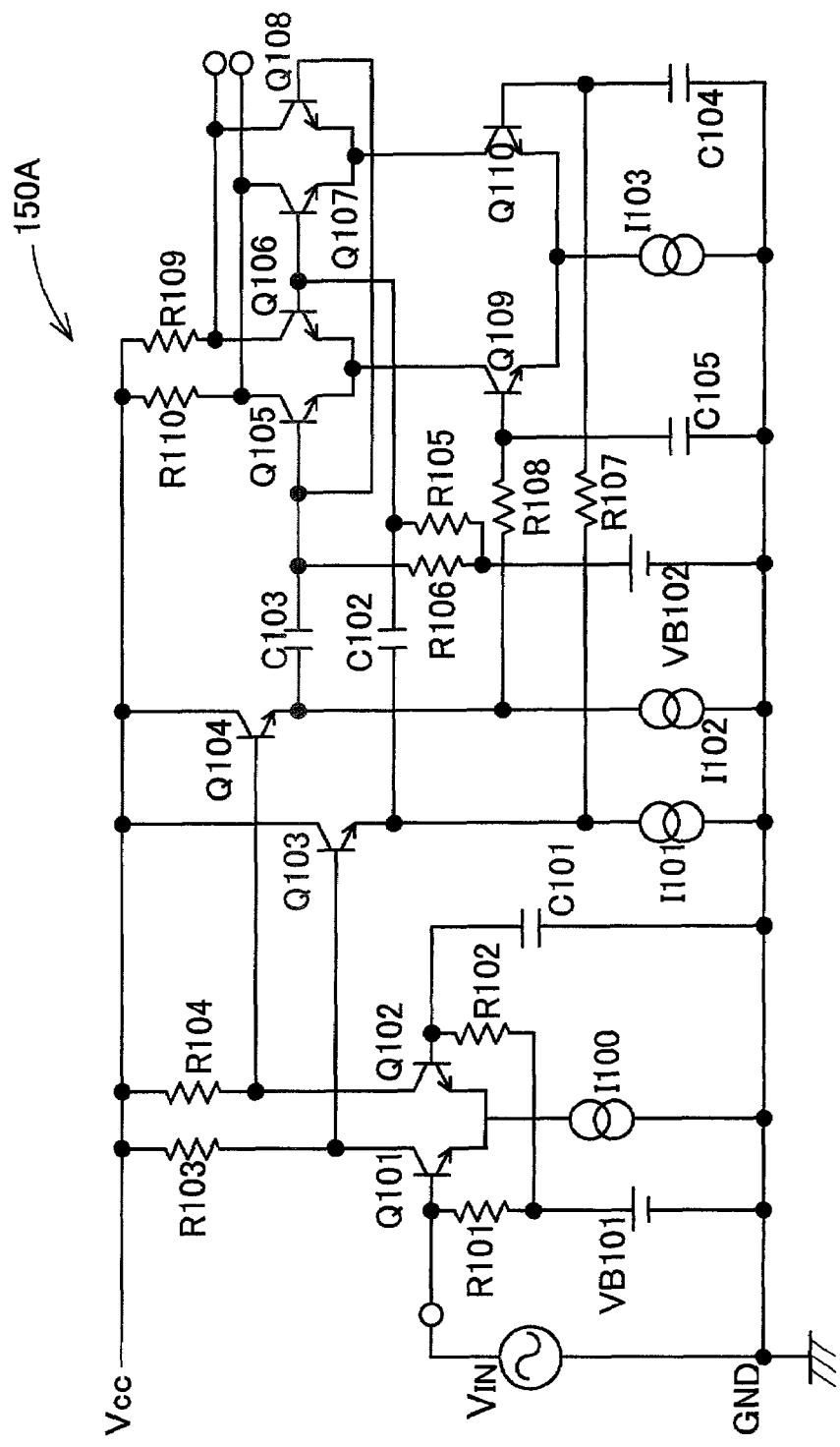
FIG. 17 is a circuit diagram of a mixer circuit (frequency doubler circuit) according the second conventional technique.

FIG. 14 shows a frequency multiplier 40 according to the fourth embodiment of the invention, in which a V/F converter 82 is disposed preceding stage of the frequency multiplier 1 shown in the first principle diagram. In the frequency multiplier 40 according to the fourth embodiment, the V/F converter 82 corresponds to the modulation section 8 of the frequency modulator 2 shown in the second principle diagram. As for specific examples of the frequency multiplier 1, it may be the frequency multiplier 10 or 10A according to the first embodiment or the frequency multiplier 20 according to the second embodiment. A signal obtained by converting an original input frequency signal $V_{IN}$ having a prescribed voltage value with the V/F converter 82 is input to the frequency multiplier 10, 10A, or 20 as an input signal $V'_{IN}$.

With this configuration, the conversion of an input voltage signal into a signal having an arbitrary frequency can be performed by the V/F converter 82 in addition to the frequency multiplication by the frequency multiplier 10, 10A, or 20. Therefore, an output frequency signal $V_{OUT}$ can be produced by switching among signals having arbitrary frequencies. If this embodiment is applied to a case that an input frequency signal $V_{IN}$ has a particular voltage value, the input frequency signal $V_{IN}$ can be converted into a signal having an arbitrary frequency.

The invention is not limited to the above embodiments. It goes without saying that various improvements and modifications are possible without departing from the spirit and scope of the invention.

For example, although the first embodiment is directed to the case that the transistors Q1 and Q2 having the same conductivity type and size constitute the input differential pair and the resistance elements R3 and R4 having the same characteristic and size serve as loads, imbalance may be introduced as appropriate between the transistors Q1 and Q2 or the resistance elements R3 and R4. Differential output signals can be given a voltage level difference by making a differential pair unsymmetrical in terms of the transistor size or the load resistance value. Therefore, it is possible to adjust the signal levels of differential output voltages as appropriate and thereby switch the frequency by switching the transistor size or the load resistance value as appropriate using a switch or the like or by employing active elements such as MOS transistors or bipolar transistors as load resistors and switching a load resistance value by properly adjusting, for example, a bias voltage of a gate terminal or a bias current flowing through a base terminal.

Also in the second embodiment, as in the case of the first embodiment, differential output voltages can be given desired voltage level differences by introducing imbalance among the transistors constituting the input differential pairs, Q11 and Q12, to Q17 and Q18, the level shift differential pairs, Q19 and Q20, and Q21 and Q22, or the like or the resistance elements R11, R12, R15, R16, and R19 to R22. It is also possible to switch the frequency by adjusting the signal levels of differential output voltages as appropriate by making proper adjustments using a switch or the like or a bias voltage or current. In the level shift section 72 of the second embodiment, the bias voltage values of the voltage sources VB21 to VB24 for applying bias voltages to the differential input terminals are adjusted as appropriate to switch the multiplication number of the frequency. However, the invention is not limited to such a case. The frequency of an output frequency signal $V_{OUT}$ can be switched by adjusting the voltage level of each differential output voltage by applying unsymmetrical weighting to the sizes of the transistors of a level shift differential pair, the load resistance values, or the like or by applying different manners of weighting to the bias current values or the load resistance values of two level shift differential pairs, instead of or in addition to the adjustment of the bias voltage values for the differential input terminals.

In the second embodiment, the frequency of an output frequency signal $V_{OUT}$ is switched among the same frequency as the frequency of an input frequency signal $V_{IN}$ and its double, triple, and quadruple frequencies by generating four-phase signals that are deviated from each other in phase by 90° based on the input frequency signal $V_{IN}$. However, the invention is not limited to such a case. An output frequency signal $V_{OUT}$ whose frequency is an arbitrary multiplication number of times higher than the frequency of an input frequency signal $V_{IN}$ can be obtained by generating multi-phase frequency signals having arbitrary phase differences. For example, an output frequency signal $V_{OUT}$ whose maximum frequency is six times higher than the frequency of an input frequency signal $V_{IN}$ can be obtained by generating six-phase frequency signals that are deviated from each other in phase by 60°.

The first to third embodiments are directed to the case that a sinusoidal signal such as a sine wave having a prescribed frequency is input as an input frequency signal $V_{IN}$. However, the invention is not limited to such a case. Rather than sinusoidal waveforms, waveforms having polygonal shapes such as triangular waves (e.g., a saw-tooth wave) may be input. In the latter case, output frequency signals $V_{OUT}$ having frequencies of different multiplication numbers can be produced without extracting harmonic components from an input signal.

In the fourth embodiment, a signal having a prescribed voltage value is input as an input frequency signal $V_{IN}$. However, the invention is not limited to such a case. A modification is possible in which a current signal, rather than a voltage signal, is input and a current/voltage converter is disposed preceding stage of the V/F converter 82 or a current/frequency converter is provided instead of the V/F converter 82.

The first and second embodiments are directed to the case that the reference voltage $V_{REF}$ of the comparators 61, 61A, and 62 is a fixed value. However, the invention is not limited to such a case. It is also possible to change the multiplication number of the frequency of an output frequency signal $V_{OUT}$ by adjusting the reference voltage $V_{REF}$ as appropriate. For example, in the frequency multiplier 20 according to the second embodiment, if the bias voltage value of the voltage source VB23 is higher than that of the other voltage sources VB21, VB22, and VB24 (voltage value: VB21=VB22=VB24<VB23; see FIG. 10), a full-wave rectified signal VM2 is produced that is a waveform having three different peak voltage values that correspond to a level shift signal VLS23 that is shifted to the low-voltage side by a voltage ΔV, level shift signals VLS21 and VLS22 having no level shift due to an offset between the transistors of a differential pair, and a level shift signal VLS24 that is shifted to the high-voltage side by the voltage ΔV. Therefore, by properly setting the reference voltage $V_{REF}$ for the above peak voltage values, the same frequency as the frequency of an input frequency signal $V_{IN}$ (VLS21−α<$V_{REF}$<VLS24−α), a triple frequency (VLS23−α<$V_{REF}$<VLS21−α), and a quadruple frequency ($V_{REF}$<VLS23−α) can be obtained, where a is the base-emitter forward voltage of the transistors Q23 to Q26 plus the forward voltage of the diodes D3 to D6.

Although the first and second embodiments are directed to the case that an input frequency signal $V_{IN}$ is a single-phase signal, the invention is not limited to such a case. It goes without saying that differential input signals may be input to the input differential pair.

A frequency multiplier capable of multiplying the frequency by three or more can be constructed by providing two or more input differential pairs in the specific example of the first embodiment and inputting frequency signals having prescribed phase differences to the respective differential pairs. For example, two input differential pairs are provided and frequency signals having a phase difference of 90° are input to the respective input differential pairs. Since each input differential pair can produce differential output signals having a phase difference of 180°, an output frequency signal $V_{OUT}$ having a quadruple frequency can be produced in the maximum case. Conversely, in the configuration of the second embodiment, it is also possible to produce an output frequency signal $V_{OUT}$ having a double frequency in the maximum case.

The invention can provide a frequency multiplier capable of switching as appropriate among frequency signals having frequencies obtained by multiplying prescribed multiplication numbers with low current consumption and a simple circuit configuration ineffectively utilizing frequencies in radio communication equipment such as cellular phones.

What is claimed is:

1. A frequency multiplier comprising:
   a phase shift section generating at least one phase shift signal based on a fundamental signal;
   a waveform combining section generating a combined waveform by combining signal waveforms of the same polarity obtained by wave-rectifying the fundamental signal and the phase shift signal; and
   a comparator section comparing the combined waveform with a variable comparison threshold voltage based on a frequency of a multiplied waveform.

2. The frequency multiplier according to claim 1, further comprising a level shift section for shifting amplitude levels of at least any one of the fundamental signal and the phase shift signal prior to the generation of the combined waveform.

3. The frequency multiplier according to claim 2, wherein the level shift section comprises a switching control section for switching, as appropriate, driving ability for each of the fundamental signal and the phase shift signal.

4. The frequency multiplier according to claim 3, wherein the driving ability is a size of a transistor for outputting the fundamental signal or the phase shift signal.

5. The frequency multiplier according to claim 3, wherein the driving ability is a current value of a driving current source for outputting the fundamental signal or the phase shift signal.

6. The frequency multiplier according to claim 3, wherein the driving ability is a size of a load element for determining a voltage level of the fundamental signal or the phase shift signal.

7. The frequency multiplier according to claim 1, wherein the comparator section can adjust the comparison threshold voltage as appropriate.

8. The frequency multiplier according to claim 2, wherein the level shift section can adjust the amplitude levels as appropriate for each of the fundamental signal and the phase shift signal.

9. The frequency multiplier according to claim 1, wherein the phase shift section comprises a phase inverting section.

10. The frequency multiplier according to claim 9, wherein the phase inverting section comprises a differential pair.

11. The frequency multiplier according to claim 1, wherein the phase shift section comprises at least one of a phase advancing section and a phase delaying section for generating the phase shift signal having a prescribed phase difference with respect to the fundamental signal.

12. The frequency multiplier according to claim 11, wherein the at least one of the phase advancing section and the phase delaying section comprises one of a capacitive load element and an inductive load element.

13. The frequency multiplier according to claim 1, wherein the waveform combining section comprises a full-wave rectifier section.

14. The frequency multiplier according to claim 1, further comprising:
    an input differential pair for receiving the fundamental signal at least one of differential input terminals thereof, and for outputting differential output signals from differential output terminals thereof;
    high-pass filter sections provided for the respective differential output terminals, for interrupting DC components that are output from the respective differential output terminals;
    a second level shift section for biasing differential signals that are output from the high-pass filter sections by proper DC voltages, respectively;
    a full-wave rectifier section for full-wave-rectifying output signals of the second level shift section; and
    a second comparator section for comparing a full-wave-rectified signal that is output from the full-wave rectifier section with a reference voltage as the comparison threshold voltage.

15. The frequency multiplier according to claim 14, further comprising a differential amplifier section between the second level shift section and the full-wave-rectifier section, wherein the output signals of the second level shift section are input to the full-wave rectifier section after being amplified by the differential amplifier section.

16. The frequency multiplier according to claim 1, further comprising an FM modulator, wherein the fundamental signal is obtained by frequency-modulating an original signal with the FM modulator when the original signal is a frequency signal.

17. The frequency multiplier according to claim 1, further comprising a V/F converter, wherein the fundamental signal is a frequency signal obtained by converting an original signal with the V/F converter when the original signal is a voltage signal.

18. The frequency multiplier according to claim 1, further comprising:
    an input differential pair for receiving the fundamental signal at at least one of differential input terminals thereof, and for outputting differential output signals;
    a first level shift section for biasing the differential input terminals by proper DC voltages, respectively;
    a full-wave rectifier section for full-wave-rectifying the differential output signals; and a first comparator section for comparing a full-wave-rectified signal that is output from the full-wave rectifier section with a reference voltage as the comparison threshold voltage.

19. The frequency multiplier according to claim 18, further comprising:
two or more input differential pairs for receiving the fundamental signal and the at least one phase shift signal having the prescribed phase difference with respect to the fundamental signal; and
one of a phase advancing section and a phase delaying section for generating each phase shift signal individually.

20. The frequency multiplier according to claim 19, wherein the first level shift section comprises a switching control section for switching and controlling current values of bias current sources for driving the input differential pairs.

21. The frequency multiplier according to claim 18, wherein the first level shift section further comprises a switching control section for switching, as appropriate, sizes of transistors of a transistor pair of the input differential pair or resistance values of load resistors of the input differential pair.

22. The frequency multiplier according to claim 18, wherein load resistors that are connected to the input differential pair are active loads including MOS transistors, and the first level shift section further comprises a switching control section for switching and controlling bias voltages for gate terminals of the respective MOS transistors.

23. The frequency multiplier according to claim 18, wherein load resistors that are connected to the input differential pair are active loads including bipolar transistors, and the first level shift section comprises a switching control section for switching and controlling base currents flowing through base terminals of the respective bipolar transistors.

* * * * *